United States Patent
Tomita

(10) Patent No.: US 6,493,275 B2
(45) Date of Patent: Dec. 10, 2002

(54) SEMICONDUCTOR INTEGRATED CIRCUIT DEVICE AND ELECTRONIC EQUIPMENT

(75) Inventor: Yasuhiro Tomita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/921,912

(22) Filed: Aug. 6, 2001

(65) Prior Publication Data

US 2002/0033510 A1 Mar. 21, 2002

(30) Foreign Application Priority Data

Aug. 7, 2000 (JP) ........................................ 2000-237931

(51) Int. Cl.[7] ................................................ G11C 7/00
(52) U.S. Cl. .............. 365/189.09; 365/203; 365/230.06
(58) Field of Search ............................ 365/230.06, 203, 365/189.09, 189.01, 230.01

(56) References Cited

U.S. PATENT DOCUMENTS

| 5,111,064 | A | | 5/1992 | Ward | |
|---|---|---|---|---|---|
| 5,589,786 | A | | 12/1996 | Bella et al. | |
| 5,656,960 | A | | 8/1997 | Holzer | |
| 5,672,995 | A | * | 9/1997 | Hirase et al. | ................ 327/534 |
| 6,147,386 | A | * | 11/2000 | Horiuchi | ..................... 257/369 |
| 6,256,246 | B1 | * | 7/2001 | Ooishi | ........................ 365/203 |
| 6,340,852 | B1 | * | 1/2002 | Mizoguchi | .................. 307/125 |

* cited by examiner

Primary Examiner—Hoai Ho
(74) Attorney, Agent, or Firm—McDermott, Will & Emery

(57) ABSTRACT

Each inverter includes any of a P-channel modulation MOS transistor, a normal N-channel MOS transistor, a normal P-channel MOS transistor, and an N-channel modulation MOS transistor. A modulation substrate bias Vb of the P-channel modulation MOS transistor varies with a prescribed amplitude within the range of Vb.Vdd−Vf. A modulation substrate bias Vb' of the N-channel modulation MOS transistor varies with a prescribed amplitude within the range of Vb'.Vss+Vf. With a threshold value of the modulation MOS transistor being varied, the transition timing and waveform of a signal are varied, whereby the peak of the EMI radiation becomes gentler. As a result, EMI radiation is reduced while preventing malfunction such as latch-up.

10 Claims, 14 Drawing Sheets

FIG. 17
FIG. 17A
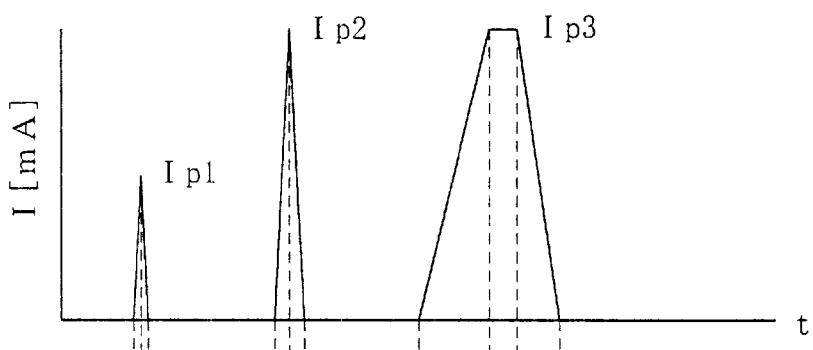
FIG. 17B
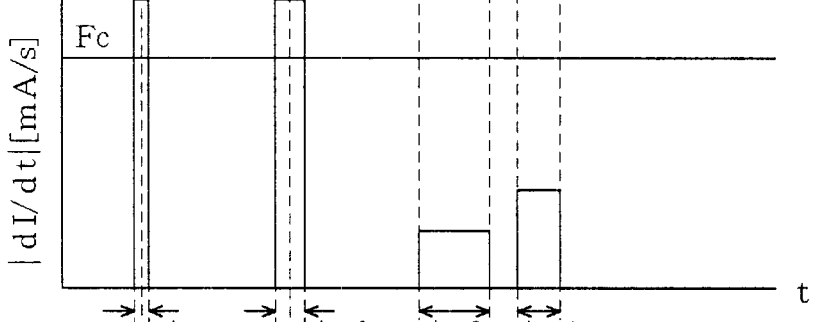
FIG. 17C
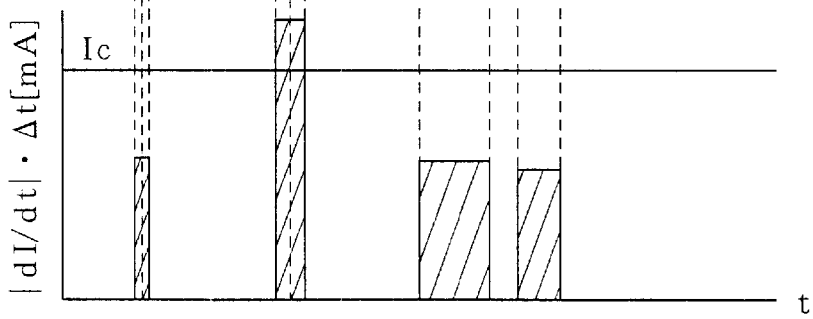

SEMICONDUCTOR INTEGRATED CIRCUIT DEVICE AND ELECTRONIC EQUIPMENT

BACKGROUND OF THE INVENTION

The present invention generally relates to a semiconductor integrated circuit device incorporating a MIS (Metal Insulator Semiconductor) transistor. More particularly, the present invention relates to a measure to reduce electromagnetic radiation intensity.

Conventionally, it is known that electronic equipments generate unwanted electromagnetic radiation called EMI (Electromagnetic Interference) radiation. It is desired that this EMI radiation be as small as possible due to its possible interference with operation of another electronic equipment. Therefore, the EMI radiation intensity is subjected even to the legal controls. The EMI radiation is generated due to various causes, but operating characteristics of a huge number of transistors included in LSI (Large Scale Integration) of the electronic equipment, particularly MOS (Metal Oxide Semiconductor) transistors in a CMOS (Complementary Metal-Oxide Semiconductor) integrated circuit, are an important cause. A switching waveform of the MOS transistor includes high-frequency components due to an abrupt change in voltage and current. Accordingly, a portion serving an antenna within the electronic equipment generates unwanted electromagnetic radiation according to such an abrupt change.

In the frequency range up to several tens of gigahertz (GHz), a semiconductor integrated circuit device itself has low EMI radiation intensity because it has few portions serving as an antenna. However, when a semiconductor chip, i.e., a semiconductor integrated circuit device, is mounted on a printed circuit board or a package, power supply lines and signal lines having several to several tens of centimeters are extended therein. Thus, these power supply lines and signal lines serve as an antenna, increasing the EMI radiation intensity. Moreover, the EMI radiation intensity largely depends on a mounting form. It is preferable to avoid a mounting form that has a large number of portions serving an antenna as much as possible. In general, in order to reduce the EMI radiation intensity, a pattern shape of the power supply and signal lines on the printed circuit board is changed, or a part having a function to suppress a high-frequency current such as ferrite beads is incorporated. However, these methods are often based on the empirical rule. Therefore, prediction of the effect is difficult, and the costs are also increased. Accordingly, it is preferable to reduce the EMI radiation at the MOS transistor level in the semiconductor integrated circuit device, thereby ensuring the flexibility of mounting forms without considering the EMI radiation.

In particular, the MOS transistors in the recent CMOS semiconductor integrated circuit devices have an increased operation speed as a result of the progress in miniaturization technology. This causes ever-increasing EMI radiation intensity due to an increased switching operation speed, i.e., rise and fall time, of the MOS transistors. In this respect as well, means for effectively reducing the EMI radiation in connection with the operating characteristics of the MOS transistors has been greatly demanded.

The following methods have been proposed for reducing the EMI radiation in connection with the operation characteristics of the MOS transistors in the semiconductor integrated circuit device:

(1) Optimize the transistor size. More specifically, the rising/falling rate of a voltage waveform (which is referred to as "slew rate") is reduced as much as possible in order to reduce harmonic components of the frequency included in a voltage amplitude. Alternatively, the slew rate and maximum amplitude of a current waveform in the switching operation of the transistors are reduced in order to suppress the intensity of electromagnetic waves generated from a power supply line and the like;

(2) Avoid simultaneous switching of the transistors. More specifically, the delay time is adjusted so as to disperse the switching time of the transistors, thereby reducing concentrated generation of electromagnetic waves (EMI radiation) from a power supply line due to simultaneous switching. Thus, the EMI radiation intensity from the power supply line and the like is reduced; and (3) Using a spread spectrum clock system, i.e., technology of reducing the EMI radiation by frequency modulation of a clock signal, to suppress the intensity of electromagnetic waves generated from the clock system.

The spread spectrum clock system is the technology of varying a clock frequency (fc) by a small amount ($\delta$) in a period of a modulation frequency (fm), and thus diffusing the energy distribution of harmonic EMI radiation of the clock in a high-frequency region, thereby reducing the peak value of the EMI radiation. This technology is widely used in the recent CMOS semiconductor integrated circuit devices, and is described in, e.g., U.S. Pat. No. 5,488,627 titled "Spread Spectrum Clock Generator and Associated Method". For example, the use of the spread spectrum clock system enables reduction in electric field intensity of the EMI radiation by about 10 dB by, e.g., setting the modulation frequency (fm) to 50 KHz, i.e., about 0.5% of the clock frequency (fc) of the frequency shift ($\delta$). It is known that the harmonic intensity distribution of the clock in the high-frequency region has a width of about $\delta$, and the profile thereof is determined by time variation of $\delta$ in a period of 1/fm (which is referred to as modulation profile). In general, clock-related circuitry includes a clock generation circuit for generating a clock signal, and a clock buffer for distributing the generated clock to each circuit within the integrated circuit. In the spread spectrum clock system, a frequency-modulated clock is generated by the clock generation circuit, and then supplied from the clock buffer to each circuit.

SUMMARY OF THE INVENTION

It is an object of the present invention to implement a semiconductor integrated circuit device generating reduced EMI radiation while operating at a high speed, by finely dispersing the rise and fall of each MOS transistor by using relatively simple design and structure in view of operating characteristics of the MOS transistors in the semiconductor integrated circuit device.

According to the present invention, a semiconductor integrated circuit device integrating a plurality of MIS (Metal Insulator Semiconductor) transistors each having its source and drain provided in a respective region of a semiconductor substrate that is surrounded by a substrate region, and its gate provided on a region of the semiconductor substrate that is located between the source and drain, wherein the plurality of MIS transistors include at least one of a P-channel modulation MIS transistor and an N-channel modulation MIS transistor, a modulation substrate bias Vb varying with a prescribed amplitude within such a range that causes no latch-up is applied to the P-channel modulation MIS transistor, and a modulation substrate bias Vb' varying with a prescribed amplitude within such a range that causes no latch-up is applied to the N-channel modulation MIS transistor.

Thus, in response to application of the modulation substrate bias to the substrate region of the modulation MIS transistor, a threshold voltage and current driving capability of the modulation MIS transistor vary with time within the range that causes no latch-up. Accordingly, a logic threshold voltage, delay time, and rise and fall time of an output waveform of, e.g., a complementary logic gate including the modulation MOS transistor are modulated, whereby energy spectrum of electromagnetic waves radiated during signal transition has a larger peak width than that in the case where there is no modulation. Accordingly, the peak value and thus the EMI radiation intensity are reduced while maintaining a proper operation of the semiconductor integrated circuit device.

Preferably, in the aforementioned semiconductor integrated circuit device, the modulation substrate bias Vb varying with the prescribed amplitude within a range of $Vb \geq Vdd-Vf$ is applied to a substrate region of the P-channel modulation MIS transistor, where Vdd is a drain potential, Vss is a source potential, and Vf is a forward voltage across a PN junction between the drain and the substrate region, and the modulation substrate bias Vb' varying with the prescribed amplitude within a range of $Vb' \leq Vss+Vf'$ is applied to a substrate region of the N-channel modulation MIS transistor, where Vdd is a drain potential, Vss is a source potential, and Vf' is a forward voltage across a PN junction between the substrate region and the source. Thus, even in the structure of a complementary MIS transistor, a forward voltage that activates a parasitic bipolar transistor is not applied. As a result, malfunction such as latch-up due to actuation of a parasitic bipolar transistor is more reliably prevented.

Preferably, the semiconductor integrated circuit device further includes a driving circuit for driving a gate electrode of the MIS transistors through which a current having an at least predetermined change rate and at least predetermined variation flows between the drain and source electrodes thereof during switching operation, and the driving circuit includes the modulation MIS transistor. Thus, a modulated output of the driving circuit is applied to the gate electrode of a MIS transistor having a particularly large variation in current. Therefore, the switching (ON/OFF switching) timing of this MIS transistor is modulated, whereby energy distribution of electromagnetic waves resulting from signal transition has a wider, gentler peak, whereby the EMI radiation can be effectively reduced. By forming a limited number of MIS transistors from a modulation MIS transistor, the number of extended electrodes of a substrate bias provided separately from the extended electrodes of the source and drain is suppressed. As a result, increase in layout area can be suppressed.

Preferably, the semiconductor integrated circuit device includes at least two circuits each including a plurality of MIS transistors including the modulation MIS transistor, and having different overall delay times, and a modulation substrate bias having a larger amplitude is applied to the circuit having a shorter delay time than to the circuit having a longer delay time. Thus, EMI radiation can be effectively reduced within the range that causes no defective signal transmission in the entire semiconductor integrated circuit device.

Preferably, the semiconductor integrated circuit device further includes a modulation substrate bias generation circuit having a function to program a waveform profile of the modulation substrate bias. Thus, various kinds of devices adaptable to various mounting forms can be implemented with a single device, i.e., with the same structure, and also a semiconductor integrated circuit device having an optimized balance between the EMI radiation and the operation speed can be obtained.

Preferably, the semiconductor integrated circuit device includes: a memory cell array having a plurality of memory cells arranged therein; bit line pairs connected to the memory cell array; precharge transistors for precharging the bit line pairs; and a driving circuit for driving gate electrodes of the precharge transistors, wherein at least one of the driving circuit and the precharge transistors includes the modulation MIS transistor. Thus, a current flowing through the precharge transistors during precharge operation of the bit lines can be subjected to frequency modulation. Normally, the EMI radiation is rapidly increased when a multiplicity of bit lines are precharged. However, the peak of the EMI radiation can be reduced by application of a modulated current.

Preferably, the semiconductor integrated circuit device includes: a circuit including a plurality of MIS transistors, the plurality of MIS transistors being part of the plurality of MIS transistors; a bus signal line extended from the circuit; and a driving circuit provided in the circuit, for outputting data to the bus signal line, the driving circuit including the modulation MIS transistor. Thus, a power supply current and output waveform of the driving circuit are subjected to frequency modulation. Normally, the EMI radiation is rapidly increased when the bus has a multi-bit width. According to the present invention, however, such frequency modulation enables reduction in the peak value of the EMI radiation.

Preferably, the semiconductor integrated circuit device includes a driving circuit of a pad for receiving and outputting a signal from and to an external equipment of the semiconductor integrated circuit device, the driving circuit of the pad including the modulation MIS transistor. Thus, the slew rate of an output waveform of the pad is subjected to frequency modulation, whereby the peak of the EMI radiation is reduced. Moreover, a power supply current is modulated. Although EMI radiation from a power supply line is significantly increased due to simultaneous signal transition of the driving circuits of the pads, the peak of such EMI radiation can also be reduced by such a modulated power supply current. The transistor in the driving circuit of the pad generally has a high EMI radiation level since it receives a large current and is directly connected to an external wiring serving as an antenna. According to the present invention, however, such EMI radiation can also be effectively reduced.

According to the present invention, an electronic equipment has mounted therein a plurality of first semiconductor integrated circuit devices and a second semiconductor integrated circuit, wherein each of the first semiconductor integrated circuit devices is a semiconductor integrated circuit device integrating a plurality of MIS transistors each having its source and drain provided in a respective region of a semiconductor substrate that is surrounded by a substrate region, and its gate provided on a region of the semiconductor substrate that is located between the source and drain, the plurality of MIS transistors include at least one of a P-channel modulation MIS transistor and an N-channel modulation MIS transistor, a modulation substrate bias Vb varying with a prescribed amplitude within such a range that causes no latch-up is applied to the P-channel modulation MIS transistor, and a modulation substrate bias Vb' varying with a prescribed amplitude within such a range that causes no latch-up is applied to the N-channel modulation MIS transistor, and the second semiconductor integrated circuit device includes a modulation substrate bias generation circuit for generating the modulation substrate bias to be supplied to each of the first semiconductor integrated circuit devices.

This eliminates the need to provide a substrate bias generation circuit in each semiconductor integrated circuit device, enabling reduction in costs.

Preferably, in the first semiconductor integrated circuit devices, the modulation substrate bias Vb varying with the prescribed amplitude within a range of Vb.Vdd–Vf is applied to a substrate region of the P-channel modulation MIS transistor, where Vdd is a drain potential, Vss is a source potential, and Vf is a forward voltage across a PN junction between the drain and the substrate region, and the modulation substrate bias Vb' varying with the prescribed amplitude within a range of Vb'.Vss+Vf' is applied to a substrate region of the N-channel modulation MIS transistor, where Vdd is a drain potential, Vss is a source potential, and Vf' is a forward voltage across a PN junction between the substrate region and the source. Thus, latch-up can be reliably prevented even in a CMOS semiconductor integrated circuit device.

BRIEF DESCRIPTION OF THE DRAWINGS

FIGS. 17A to 17C are diagrams respectively showing the simulation result of various current waveforms, their corresponding change rate and variation.

DETAILED DESCRIPTION OF THE PREFERRED EMBODIMENTS (First Embodiment)

Figure 1A:
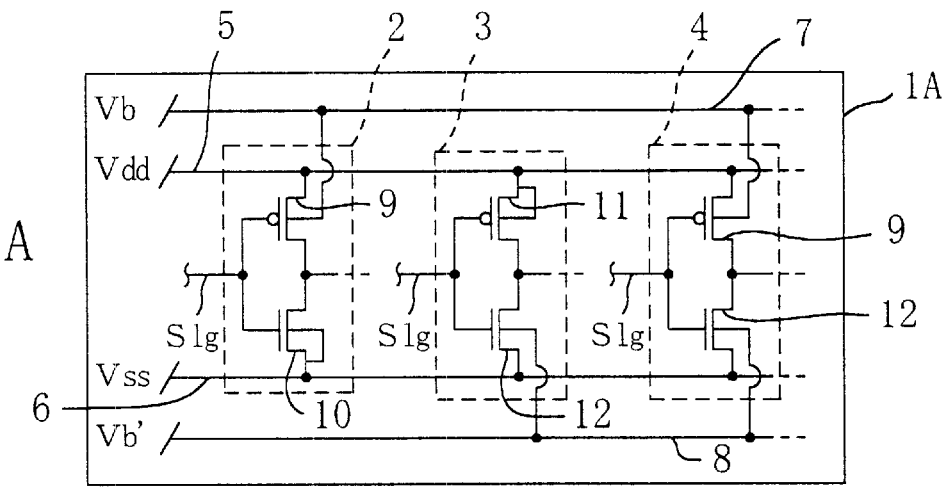
FIG. 1A is an electric circuit diagram schematically showing the structure of a semiconductor integrated circuit device according to a first embodiment of the invention.
Figure 1B:
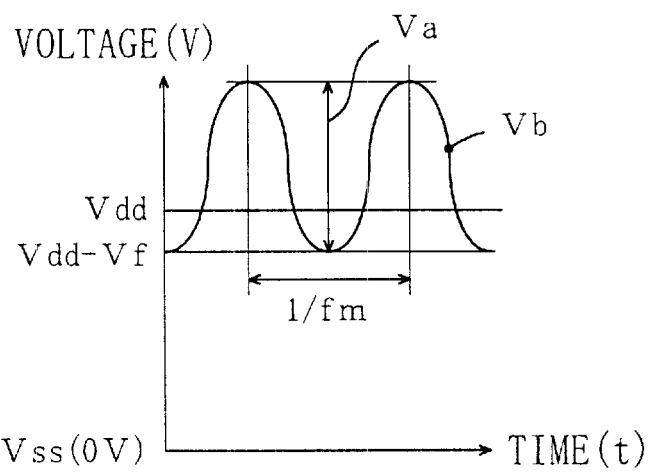
FIG. 1B is a diagram showing a change with time in a modulation substrate bias Vb of a P-channel modulation MOS transistor.
Figure 1C:
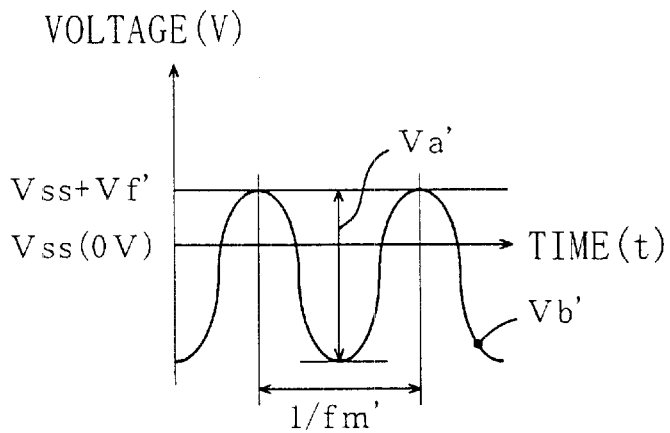
FIG. 1C is a diagram showing a change with time in a modulation substrate bias of an N-channel modulation MOS transistor.

Hereinafter, embodiments of the present invention will be described with reference to the accompanying drawings. FIG. 1A is an electric circuit diagram schematically showing the structure of a semiconductor integrated circuit device according to a first embodiment of the invention. FIG. 1B is a diagram showing a change with time in a modulation substrate bias Vb of a P-channel modulation MOS transistor. FIG. 1C is a diagram showing a change with time in a modulation substrate bias Vb' of an N-channel modulation MOS transistor.

As shown in FIG. 1A, the semiconductor integrated circuit device 1A includes inverters 2 to 4 (CMOS logic gates) each including a P-channel MOS transistor (hereinafter, referred to as "P-ch MOS transistor") and an N-channel MOS transistor (hereinafter, referred to as "N-ch MOS transistor"), a power supply line 5 for supplying a power supply potential Vdd to each inverter 2 to 4, a ground line 6 for supplying a ground potential Vss to each inverter 2 to 4, a modulation substrate bias supply line 7 for supplying a modulation substrate bias Vb to each inverter 2 to 4, a modulation substrate bias supply line 8 for supplying a modulation substrate bias Vb' to each inverter 2 to 4, and a gate voltage supply line Slg for supplying a gate voltage Vg to each MOS transistor.

It should be noted that, in the embodiments of the present invention, the term "MOS transistor" includes not only a MOS transistor having its gate insulating film formed from an oxide film, but also a transistor having its gate insulating film formed from an insulating film other than the oxide film such as a silicon nitride film or a silicon oxynitride film, i.e., a MIS transistor. For convenience, both transistors are herein referred to as "MOS transistor".

The inverter 2 includes a P-ch modulation MOS transistor 9 having a variable potential with its substrate region (well)

connected to the modulation substrate bias supply line 7, and a normal N-ch MOS transistor 10 having a fixed potential with its substrate region and source connected to the ground line 6. The inverter 3 includes a normal P-ch MOS transistor 11 having a fixed potential with its substrate region and drain being connected to the power supply line 5, and an N-ch modulation MOS transistor 12 having a variable potential with its substrate region connected to the modulation substrate bias supply line 8. The inverter 4 includes a P-ch modulation MOS transistor 9 and an N-ch modulation MOS transistor 12. Note that every P-ch MOS transistor 9, 11 has its drain connected to the power supply line 5, and every N-ch MOS transistor 10, 12 has its source connected to the ground line 6. Every MOS transistor in the circuit has its gate connected to the gate line Slg.

As shown in FIG. 1B, the modulation substrate bias Vb supplied to the substrate region of the P-ch modulation MOS transistor 9 has a waveform with a minimum value of Vdd−Vf, an amplitude of Va and a period of 1/fm (where fm is a frequency) with respect to time t. Accordingly, the modulation substrate bias Vb is given by the following equation (1):

$$Vb = Vdd - Vf + Va*F(2\pi*fm*t) \quad (0.F(\theta).1, F(\theta)=F(\theta+2\pi)). \tag{1}$$

The modulation substrate bias Vb' supplied to the substrate region of the N-ch modulation MOS transistor 12 has a waveform with a maximum value of Vss+Vf', an amplitude of Va' and a period of 1/fm' (where fm' is a frequency). Accordingly, the modulation substrate bias Vb' is given by the following equation (2):

$$Vb' = Vss + Vf' - Va'*G(2\pi*fm'*t) \quad (0.G(\theta).1, G(\theta)=G(\theta+2\pi)). \tag{2}$$

The functions F(θ) and G(θ) have an arbitrary waveform with a period of 2π and an amplitude normalized to 1. For example, a saw-tooth wave and a trigonometric function are possible as simple F(θ) and G(θ). FIGS. 1B and 1C exemplarily show a trigonometric function. The voltage Vf is a built-in voltage at a PN junction between the source and drain and the substrate region of the P-ch MOS transistor. The voltage Vf' is a built-in voltage at a PN junction between the source and drain and the substrate region of the N-ch MOS transistor. Each voltage Vf, Vf' is in the range of about 0.4 V to about 0.6 V.

Setting the minimum value of the modulation substrate bias Vb to Vdd−Vf or setting the maximum value of the modulation substrate bias Vb' to Vss+Vf' makes it possible to minimize a current flowing through the forward-biased PN junction of the drain and source of the MOS transistor. This enables suppression of variation in output voltage due to a leak current to the substrate, as well as prevention of malfunction of the circuit due to latch-up resulting from actuation of a parasitic bipolar transistor, as described later.

It should be noted that the minimum value of the modulation substrate bias Vb of FIG. 1B is not limited to Vdd−Vf. The modulation substrate bias Vb may have any minimum value as long as it is equal to or larger than Vdd−Vf. Similarly, the maximum value of the modulation substrate bias Vb' of FIG. 1C is not limited to Vss+Vf'. The modulation substrate bias Vb' may have any maximum value as long as it is equal to or smaller than Vss+Vf'. The modulation substrate bias Vb, Vb' may not be in the aforementioned range if the time is short enough not to cause a miss-operation. This is because the modulation substrate bias having sufficiently high impedance would be automatically restored to a value between Vdd−Vf and Vss+Vf'.

By frequency-modulating a substrate potential of the P-ch and N-ch MOS modulation transistors 9 and 12 like the modulation substrate biases Vb and Vb' of the above equations (1) and (2), a threshold voltage Vth of the MOS transistor is modulated. Modulation of the threshold voltage Vth has the following effects on the circuit including the modulation MOS transistors.

As a first effect, a drain current of the modulation MOS transistor is frequency-modulated, so that the rise time Trise, fall time Tfall and delay time Tpd of an output signal of the circuit including the modulation MOS transistors vary with time.

As a second effect, an input threshold voltage of the CMOS circuit including the modulation MOS transistors is frequency-modulated, so that the delay time of the CMOS circuit is frequency-modulated. Modulation of the delay time is increased as the rise time Trise and fall time Tfall of the input signal waveform are increased.

The aforementioned first effect will now be described in connection with the equations. The threshold voltage Vth is approximately given by the following equation (3):

$$Vth = Vth0 + \gamma*(\sqrt{(Vb+\phi)} - \sqrt{(\phi)}) \tag{3}$$

where Vth0, γ, φ is a constant. Accordingly, variation in threshold voltage Vth (ΔVth) with variation in modulation substrate bias Vb (ΔVb) is given by the following equation (4):

$$\Delta Vth = (\partial Vth / \partial Vb) * \Delta Vb \tag{4}$$

$$= (\gamma / (2 * \sqrt{(Vb+\phi)})) * \Delta Vb.$$

A saturation current Idsat of the transistor is approximated by the following equation (5):

$$Idsat = K1*(Vdd - Vth) \tag{5}$$

where K1 is a constant. Variation in saturation current Idsat (ΔIdsat) with variation in threshold voltage (ΔVth) is given by the following equation (6):

$$\Delta Idsat = (\partial Idsat / \partial Vth) * \Delta Vth \tag{6}$$

$$= -K1 * \Delta Vth$$

$$= -K1 * (\gamma / (2 * \sqrt{(Vb+\phi)})) * \Delta Vb$$

$$= -(K2 / \sqrt{(Vb+\phi)}) * \Delta Vb$$

where K2=K1*γ/2. It can be seen from the equation (6) that the saturation current Idsat is reduced as variation in modulation substrate bias Vb, ΔVb, is increased.

The delay time Tpd is approximated by the following equation (7):

$$Tpd = Cl*Vdd / Idsat \tag{7}$$

where Cl is a load capacity. Variation in delay time Tpd (ΔTpd) with variation in saturation current ΔIdsat is given by the following equation (8):

$$\Delta Tpd = (\partial Tpd / \partial Idsat) * \Delta Idsat \tag{8}$$

$$= -(Cl / Idsat) * (\Delta Idsat / Idsat)$$

$$= (Cl / Idsat) * K2 / \sqrt{(Vb+\phi)} * \Delta Vb / Idsat.$$

It can be seen from the equation (8) that the delay time Tpd is increased as variation in potential ΔVb is increased.

The aforementioned second effect will now be described in connection with the equations. When Vb=0(v), the trees of the N-ch and P-ch transistors respectively approximate single transistors having a threshold voltage Vth equivalent to the respective threshold voltages Vthn, Vthp of the P-ch and N-ch transistors and a current driving capability equivalent to that of the respective trees of the N-ch and P-ch transistors. In this case, a logic threshold voltage Vthc of the CMOS circuit is given by the following equation (9):

$$Vthc = (Vdd - Vthp + Vthn)/2 \qquad (9)$$
$$= Vdd/2 + (\Delta Vthn - \Delta Vthp)$$

where Vthn indicates a threshold voltage of the N-ch MOS transistor, $\Delta$Vthn indicates variation therein, Vthp indicates a threshold voltage of the P-ch MOS transistor, and $\Delta$Vthp indicates variation therein. Thus, Vthn and Vthp can be given by the following equations:

$$Vthp = Vthp(Vb=0) + Vthp;$$
$$Vthn = Vthn(Vb=0) + Vthn;$$

and $$Vthp(Vb=0) = Vthn(Vb=0).$$

Accordingly, variation in logic threshold voltage Vthc of the CMOS circuit, $\Delta$Vthc, is given by the following equation (10):

$$\Delta Vthc = Vthc - Vthc(Vb=0) \qquad (10)$$
$$= \{Vdd/2 + (\Delta Vthn - \Delta Vthp)/2\} - Vdd/2$$
$$= (\Delta Vthn - \Delta Vthp)/2.$$

Variation in delay time Tpd ($\Delta$Tpd) with variation in logic threshold voltage Vthc of the CMOS circuit varies depending on the slew rate S [V/s] of the input signal, and can be given by the following equation (11):

$$\Delta Tpd = \Delta Vthc/S \qquad (11)$$
$$= 0.5 * (\Delta Vthn - \Delta Vthp)/S.$$

In other words, variation in delay time $\Delta$Tpd with variation in logic threshold voltage is maximized when variation in threshold voltage of either N-ch or P-ch modulation MOS transistor, i.e., either $\Delta$Vthn or $\Delta$Vthp, is minimized. This is realized by reversing the phase of the waveform of the modulation substrate bias Vb, Vb'.

As has been described above, the delay time of the circuit and the rise and fall time of the output signal are modulated by varying the substrate potential of the modulation MOS transistors incorporated in the circuit.

Signal transition of the circuit using the modulation MOS transistors is dispersed asynchronously in terms of time. It is less likely that a multiplicity of signals transition simultaneously. As a result, the peak width of the power supply current flowing through the power supply line serving as an antenna is increased in terms of time as compared to the case where there is no such modulation. In other words, the peak at a prescribed frequency in the energy distribution of radiated electromagnetic waves is diffused as compared to the case where there is no modulation. Therefore, the peak value and thus the EMI radiation are reduced. In particular, as the variation amplitude of the modulation substrate bias Vb, Vb' is increased, variation in modulation substrate bias Vb, Vb' with time is increased. Therefore, the peak of the EMI radiation is diffused, so that the peak value is reduced. In addition, the output signal is shifted such that the rise and fall time thereof is increased. Accordingly, high-frequency components included in the signal can be attenuated, enabling further reduction in EMI radiation.

Figure 2:
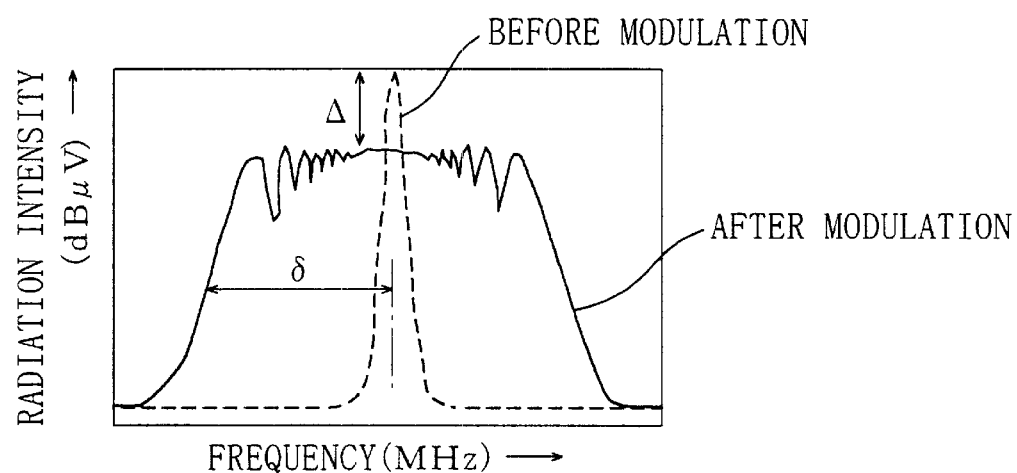
FIG. 2 is a diagram illustrating the effect of reducing the peak of EMI radiation intensity of a circuit including modulation MOS transistors by using a modulation substrate bias.

FIG. 2 shows an example of the EMI radiation intensity in a prescribed harmonic frequency region in the circuit including modulation MOS transistors. In FIG. 2, the abscissa indicates a frequency, and the ordinate indicates radiation intensity. As can be seen from FIG. 2, the EMI radiation intensity has a pointed peak in the absence of modulation. However, the peak value is reduced by a prescribed amount $\Delta$ by frequency modulation, so that the frequency distribution of the radiation is widened by a prescribed width $\delta$ on both sides.

The value of the frequency shift $\delta$ from the base frequency is determined by the amplitude Va, Va' of Vb, Vb'. The distribution profile of the frequency shift $\delta$ is determined by the form of the function F($2\pi*fm*t$), G($2\pi*fm*t$).

Provided that a trigonometric waveform, for example, is selected as a form of the function F($\theta$), G($\theta$), an effective profile of $\delta$ distribution may be obtained. However, the EMI radiation at higher frequencies may be observed depending on the form of the function F($\theta$), G($\theta$). Accordingly, it is effective to determine the function form experimentally.

Structure of Modulation MOS Transistor

Figure 3:
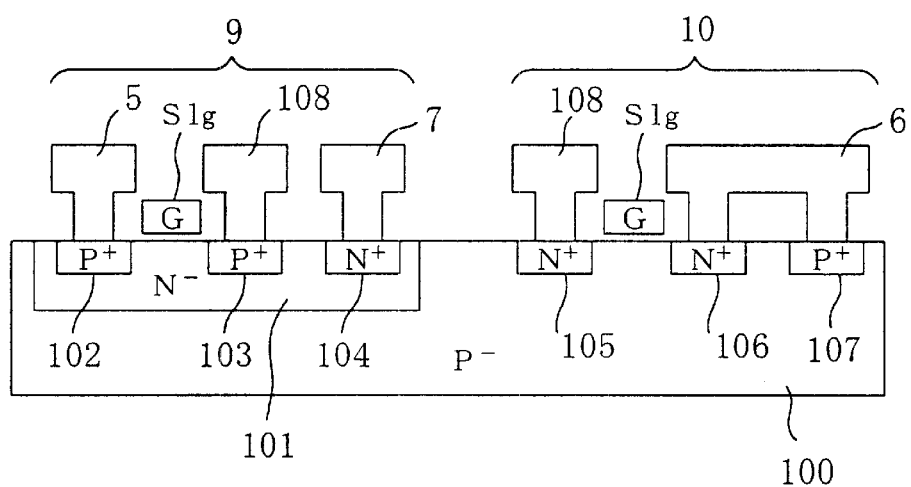
FIG. 3 is a cross-sectional view showing the structure of an inverter including a P-channel modulation MOS transistor and a normal N-channel MOS transistor according to an N-well process.

FIG. 3 is a cross-sectional view showing the structure of the inverter 2 of FIG. 1A including a P-ch modulation MOS transistor 9 and a normal N-ch MOS transistor 10 according to a single N-well process. As shown in FIG. 3, at a P-type Si substrate 100 are provided an N-well 101, a source region 102 of the P-ch modulation MOS transistor 9, a drain region 103 of the P-ch modulation MOS transistor 9, a substrate contact region 104 of the P-ch modulation MOS transistor 9, a drain region 105 of the normal N-ch MOS transistor 10, a source region 106 of the normal N-ch MOS transistor 10, and a substrate contact region 107 of the normal N-ch MOS transistor 10. In the P-ch modulation MOS transistor 9, the power supply line 5 for supplying a power supply potential Vdd is connected to the source region 102, the output line 108 is connected to the drain region 103, and the modulation substrate bias supply line 7 for supplying a modulation substrate bias Vb is connected to the substrate contact region 104. In the normal N-ch MOS transistor 10, the output line 108 is connected to the drain region 105, and the ground line 6 for supplying a ground potential Vss is connected to the source region 106 and the substrate contact region 107. The gate line Slg serving as a gate electrode is provided between the source and drain regions of each MOS transistor 9, 10 with a gate insulating film interposed between the gate line Slg and the Si substrate 100. The gate line Slg extends in the direction approximately perpendicular to the cross section of FIG. 3 so as to function also as a gate electrode of each MOS transistor of each inverter.

Arrangement of the modulation MOS transistors in the inverter depends on the manufacturing process of the semiconductor integrated circuit device. In the case of the N-well process as shown in FIG. 3, the N wells 101 are insulated from each other. Therefore, application of different modulation substrate biases Vb to the N wells 101 (substrate regions) would not cause any problem. Accordingly, a normal P-ch MOS transistor and a P-ch modulation MOS transistor can be arbitrarily provided in the N wells 101. However, the substrate region of each N-ch MOS transistor is a common Si substrate 100. Therefore, it is impossible to individually set the modulation substrate bias of each N-ch MOS transistor. Accordingly, a normal N-ch MOS transistor and a N-ch modulation MOS transistor cannot be arbitrarily provided in the Si substrate 100. In other words, either the normal N-ch MOS transistor or the N-ch modulation MOS transistor must be selected as the N-ch MOS transistors.

Figure 4:
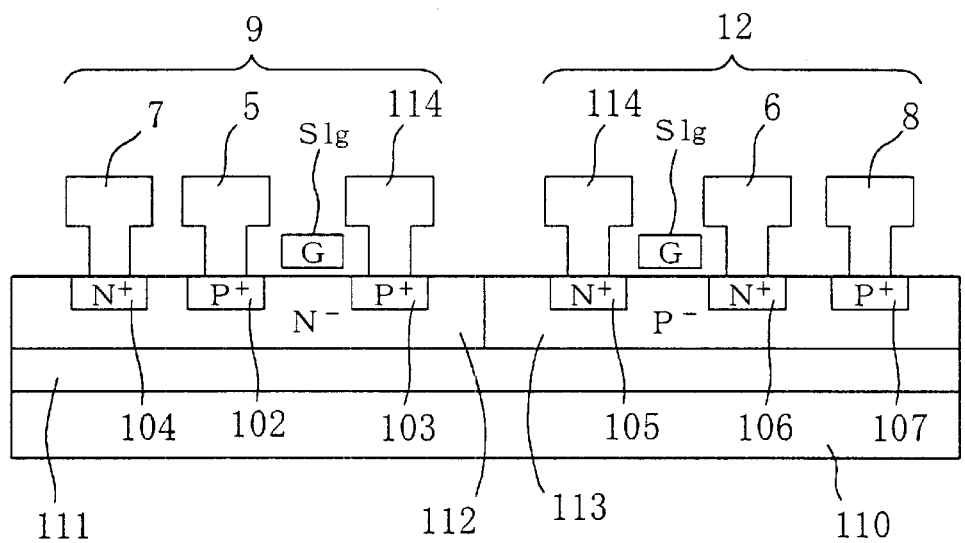
FIG. 4 is a cross-sectional view showing the structure of an inverter including a P-channel modulation MOS transistor and an N-channel modulation MOS transistor according to a twin-well process.

FIG. 4 is a cross-sectional view showing the structure of the inverter 4 of FIG. 1A including a P-ch modulation MOS transistor 9 and an N-ch modulation MOS transistor 12 according to a twin-well process. As shown in FIG. 4, at an N-type Si substrate 110 are provided an epitaxial layer 111, an N-well 112, a p-well 113, a source region 102 of the P-ch modulation MOS transistor 9, a drain region 103 of the P-ch modulation MOS transistor 9, a substrate contact region 104 of the P-ch modulation MOS transistor 9, a drain region 105 of the N-ch modulation MOS transistor 12, a source region 106 of the N-ch modulation MOS transistor 12, and a substrate contact region 107 of the N-ch modulation MOS transistor 12. In the P-ch modulation MOS transistor 9, the power supply line 5 for supplying a power supply potential Vdd is connected to the source region 102, the output line 114 is connected to the drain region 103, and the modulation substrate bias supply line 7 for supplying a modulation substrate bias Vb is connected to the substrate contact region 104. In the N-ch modulation MOS transistor 12, the output line 114 is connected to the drain region 105, the ground line 6 for supplying a ground potential Vss is connected to the source region 106, and the modulation substrate bias supply line 8 for supplying a modulation substrate bias Vb' is connected to the substrate contact region 107. The gate line Slg serving as a gate electrode is provided between the source and drain regions of each MOS transistor 9, 12 with a gate insulating film interposed between the gate line Slg and the Si substrate 110. The gate line Slg extends in the direction approximately perpendicular to the cross section of FIG. 4 so as to function also as a gate electrode of each MOS transistor of each inverter.

In the case of the twin-well process as shown in FIG. 4, the N wells 112 each surrounded by the P well 113 are electrically isolated from each other. Therefore, application of different modulation substrate biases Vb to the N wells 112 (substrate regions) would not cause any problem. Therefore, as in the case of the structure of FIG. 3, a normal P-ch MOS transistor and a P-ch modulation MOS transistor can be arbitrarily provided in the N wells 112. Moreover, the P wells 113 each surrounded by the N well 112 are isolated from each other. Therefore, application of different modulation substrate biases Vb' to the P wells 113 (substrate regions) would not cause any problem. Therefore, a normal N-ch MOS transistor and an N-ch modulation MOS transistor can be arbitrarily provided in the P wells 113.

In order to replace a normal MOS transistor with a modulation MOS transistor, a wiring connected to the substrate contact need only be changed, and the circuit structure need not be changed. Accordingly, such replacement can be easily realized.

Description will now be given for suppression of latch-up by setting the minimum value of the modulation substrate bias Vb to Vdd−Vf or setting the maximum value of the modulation substrate bias Vb' to Vss+Vf' as described above.

Figure 5:
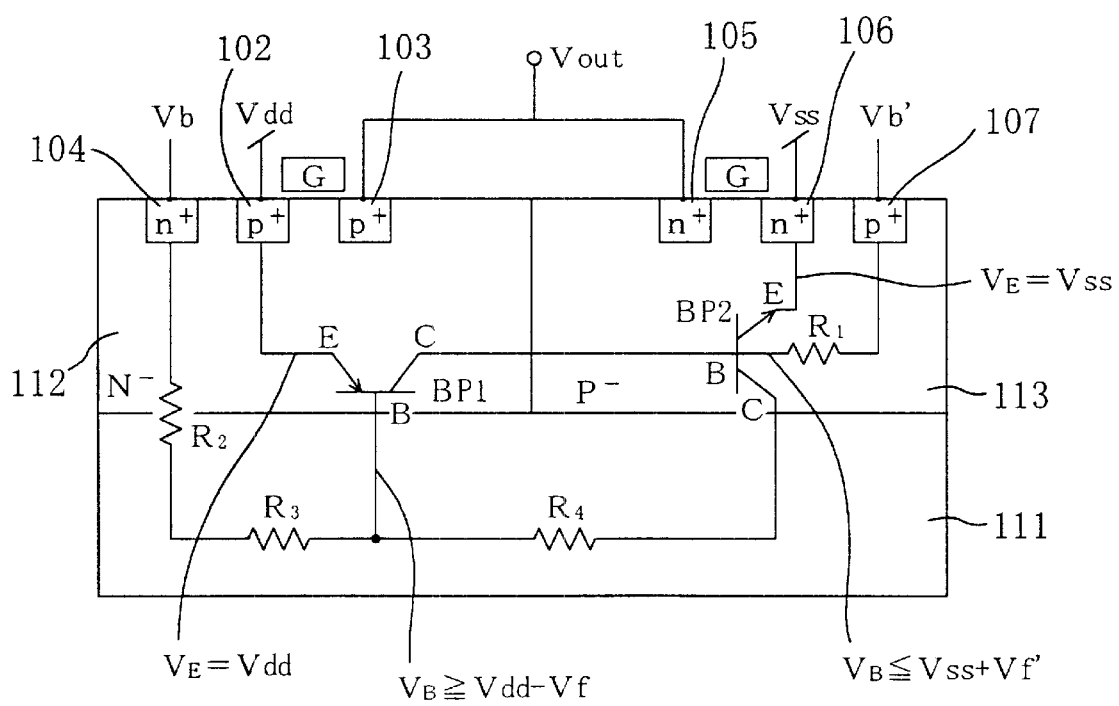
FIG. 5 is a cross-sectional view illustrating the effect of suppressing occurrence of latch-up in the structure of the inverter of FIG. 4.

FIG. 5 is a cross-sectional view showing the N-well 112 and P-well 113 in the structure of the inverter 4 of FIG. 4 including the P-ch modulation MOS transistor 9 and the N-ch modulation MOS transistor 12. As shown in FIG. 5, a parasitic PNP bipolar transistor BP1 and a parasitic NPN bipolar transistor BP2 having the collector of the parasitic PNP bipolar transistor BP1 as its base are formed in the CMOS inverter. These two parasitic bipolar transistors BP1 and BP2 serve as a thyristor. When the thyristor is turned ON due to the latch-up, a large amount of current flows between the source region 102 and the source region 106.

First, the relation between operation of the parasitic PNP bipolar transistor BP1 and the modulation substrate bias Vb will be described. As described above, the voltage Vf is a built-in voltage of about 0.5 V to about 0.6 V at a PN junction formed between the substrate region and the source and drain of the P-ch MOS transistor. The voltage Vf' is a built-in voltage of about 0.5 V to about 0.6 V at a PN junction formed between the substrate region and the source and drain of the N-ch MOS transistor. The voltages Vf and Vf' are given by the following equation: Vf, Vf'=(kT/q)ln{$(N_A-N_B)/N_i^2$} (where k is a Boltzmann's constant, q is electron charge, $N_i$ is an impurity concentration of an intrinsic semiconductor layer, $N_A$ is a P-type impurity concentration, and $N_B$ is an N-type impurity concentration). Accordingly, an emitter potential $V_E$ of the parasitic PNP bipolar transistor BP1 is equal to Vdd, and a base potential $V_B$ thereof is equal to or less than the bias potential Vb (≧Vdd−Vf), a potential in the substrate contact region 104. In other words, a bias voltage between the base and emitter is equal to or less than Vf, a built-in voltage. Since a base current for operating the parasitic PNP bipolar transistor BP1 hardly flows, actuation of the PNP bipolar transistor BP1 can be effectively inhibited and the thyristor is not turned ON. In the case of a normal P-ch MOS transistor, a potential in the substrate contact region is fixed to the power supply potential Vdd. As shown in FIG. 1B, however, the period during which the modulation substrate bias Vb of the P-ch modulation MOS transistor 9 is higher than the power supply potential Vdd is longer than that during which it is lower than the power supply potential Vdd. Accordingly, the P-ch modulation MOS transistor can prevent latch-up at least to the same degree as that of the normal P-ch MOS transistor.

Hereinafter, the relation between operation of the parasitic NPN bipolar transistor BP2 and the modulation substrate bias Vb' will be described. An emitter potential $V_Z$ of the parasitic NPN bipolar transistor BP2 is equal to Vss, and a base potential $V_B$ thereof is equal to the bias potential Vb' (≦Vss+Vf'), a potential in the substrate contact region 107. The bias voltage between the base and emitter is equal to or less than Vf'. Since a base current for operating the parasitic NPN bipolar transistor BP2 hardly flows, actuation of the parasitic NPN bipolar transistor BP2 can be effectively inhibited and the thyristor is not turned ON. In the case of a normal N-ch MOS transistor, a potential in the substrate contact region is fixed to the ground potential Vss. As shown in FIG. 1C, however, the period during which the modulation substrate bias Vb' of the N-ch modulation MOS transistor is lower than the ground potential Vss is longer than that during which it is higher than the ground potential Vss. Accordingly, the N-ch modification MOS transistor can prevent latch-up at least to the same degree as that of the normal N-ch MOS transistor.

Thus, setting the minimum value of the modulation substrate bias Vb to Vdd−Vf or setting the maximum value of the modulation substrate bias Vb' to Vss+Vf' makes it possible to effectively prevent malfunction of the circuit due to latch-up resulting from actuation of the parasitic bipolar transistor.

Note that, even if the normal N-ch MOS transistor is provided in the structure of the N-well process as shown in FIG. 3, the same effects as those in the case of FIG. 5 can be obtained except that two parasitic bipolar transistors as shown in FIG. 5 are formed and the emitter potential of the parasitic NPN bipolar transistor is fixed. The same applies to the case where the P-ch modulation MOS transistor 9 is replaced with a normal P-ch MOS transistor in the structure of FIG. 5. Accordingly, setting the minimum value of the modulation substrate bias Vb to Vdd−Vf or setting the maximum value of the modulation substrate bias Vb' to Vss+Vf' is effective also in preventing latch-up of the inverters 3 and 4 of FIG. 1A.

It should be appreciated that, by setting the minimum value of the modulation substrate bias Vb of the P-ch modulation MOS transistor 9 to Vdd−Vf, a forward voltage applied across the PN junction formed between the drain region 102 and the substrate region, i.e., the N-well 112, can be maintained at Vf or less, thereby also enabling reduction in leak current. Similarly, it should be appreciated that, by setting the maximum value of the modulation substrate bias Vb' of the N-ch modulation MOS transistor 12 to Vss+Vf', a forward voltage applied across the PN junction formed between the substrate region, i.e., the P-well 113, and the source region 106 can be maintained at Vf' or less, thereby also enabling reduction in leak current.

It should be understood that, in the structure of FIG. 1A, an inverter including a normal P-ch MOS transistor and a normal N-ch MOS transistor may be provided in the integrated circuit device 1A.

Note that, provided that the substrate potential has sufficiently high impedance, the modulation bias value can automatically be settled around Vdd−Vf, Vss+Vf'. Although Vb.Vdd−Vf and Vb'. Vss+Vf' in the present embodiment, the biases Vb and Vb' may not be in the aforementioned range if for a short time as long as latch-up and malfunction of the circuit do not occur.

First Modification of First Embodiment

Figure 6:
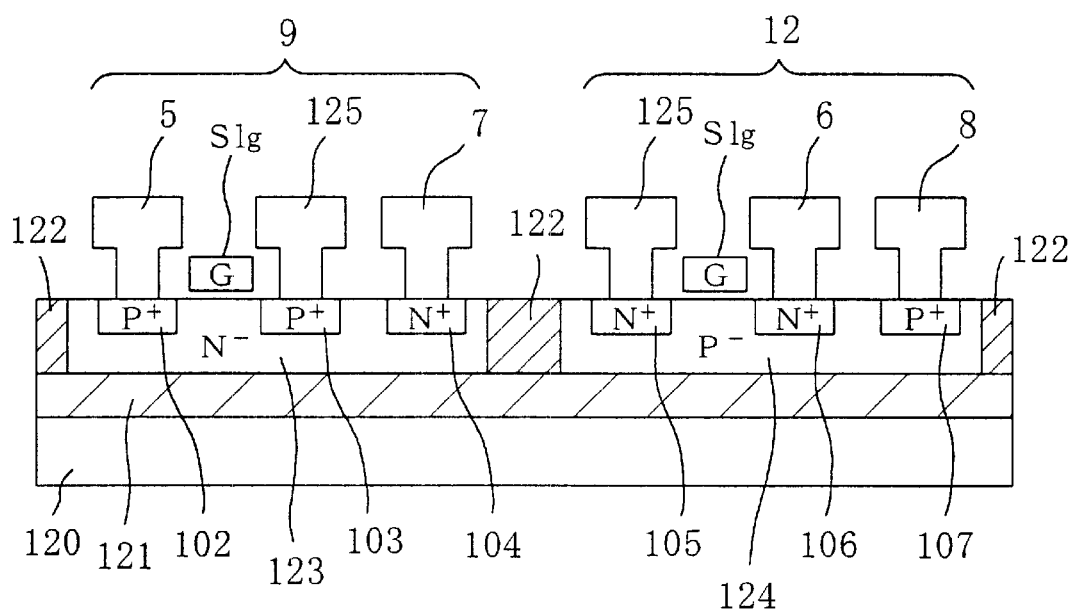
FIG. 6 is a cross-sectional view showing the structure of an inverter including a P-channel modulation MOS transistor and an N-channel modulation MOS transistor according to a first modification of the first embodiment, wherein the inverter is implemented with an SOI (Silicon On Insulator) structure.

FIG. 6 is a cross-sectional view showing the structure of the inverter 4 of FIG. 1A including a P-ch modulation MOS transistor 9 and an N-ch modulation MOS transistor 12 according to an SOI structure. As shown in FIG. 6, at an Si substrate 120 are provided an insulating layer 121 of a silicon oxide film formed at a prescribed depth in the Si substrate 120 by, e.g., implantation of oxygen ions and heat treatment, an element isolation insulating film 122 for partitioning an Si layer remaining on the insulating layer 121 so as to define each transistor-formation region, an N-well 123 and a P-well 124 each surrounded by the element isolation region 122, a source region 102 of the P-ch modulation MOS transistor 9, a drain region 103 of the P-ch modulation MOS transistor 9, a substrate contact region 104 of the P-ch modulation MOS transistor 9, a drain region 105 of the N-ch modulation MOS transistor 12, a source region 106 of the N-ch modulation MOS transistor 12, and a substrate contact region 107 of the N-ch modulation MOS transistor 12. In the P-ch modulation MOS transistor 9, the power supply line 5 for supplying a power supply potential Vdd is connected to the source region 102, the output line 125 is connected to the drain region 103, and the modulation substrate bias supply line 7 for supplying a modulation substrate bias Vb is connected to the substrate contact region 104. In the N-ch modulation MOS transistor 12, the output line 125 is connected to the drain region 105, the ground line 6 for supplying a ground potential Vss is connected to the source region 106, and the modulation substrate bias supply line 8 for supplying a modulation substrate bias Vb' is connected to the substrate contact region 107. The gate line Slg serving as a gate electrode is provided between the source and drain regions of each MOS transistor 9, 12 with a gate insulating film interposed between the gate line Slg and the Si substrate 120. The gate line Slg extends in the direction approximately perpendicular to the cross section of FIG. 6 so as to function also as a gate electrode of each MOS transistor of each inverter.

This modification has the same effects as those in the case where the twin-well process of FIG. 4 is employed. In addition, according to this modification, the element isolation insulating film 122 separates the N-well 123 and the P-well 124 from each other. Therefore, a parasitic PNP bipolar transistor formed in the N-well 123 is not connected to a parasitic NPN bipolar transistor formed in the P-well 124, whereby the thyristor as shown in FIG. 5 is not formed. This eliminates the need for strict limitations (the minimum and maximum values of FIGS. 1B and 1C) on the modulation substrate bias Vb of the P-ch modulation MOS transistor 9 and the modulation substrate bias Vb' of the N-ch modulation MOS transistor 12 in view of latch-up. In other words, design flexibility is increased, as well as latch-up can be more reliably prevented.

Second Modification of First Embodiment

FIG. 1A shows an example of the inverter circuit including the modulation MOS transistors. The circuit including a modulation MOS transistor according to the invention is not limited to the inverter circuit. Hereinafter, the second modification of the first embodiment will be described.

Figure 7:
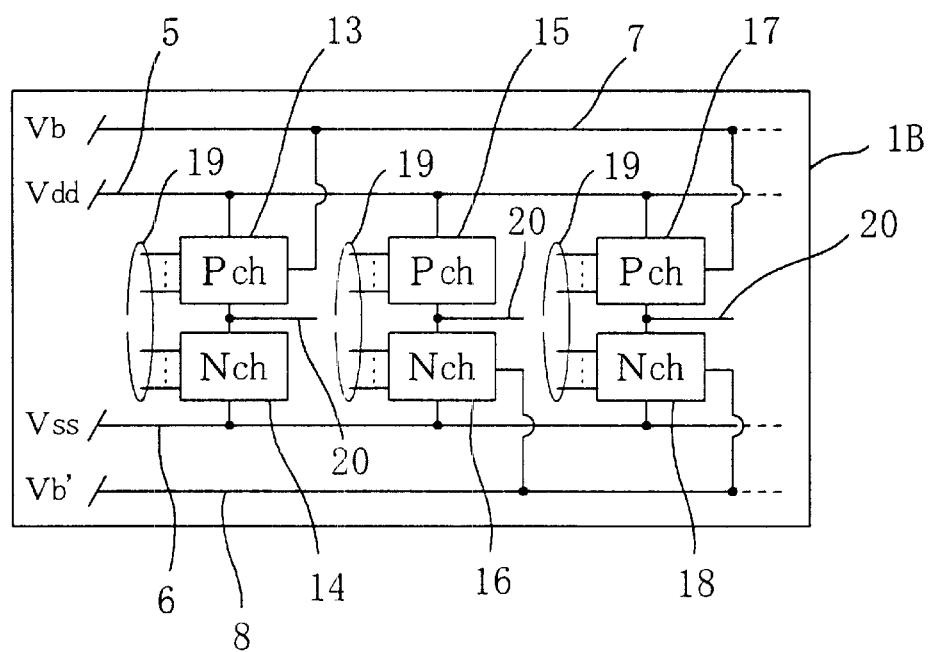
FIG. 7 is a block circuit diagram showing a semiconductor integrated circuit device including modulation MOS transistors in CMOS tree circuits according to a second modification of the first embodiment.

FIG. 7 is a block circuit diagram showing a semiconductor integrated circuit device 1B according to the second modification, wherein the modulation MOS transistor is provided in a CMOS tree circuit. In FIG. 7, the semiconductor integrated circuit device 1B shows logic gates of three CMOS tree circuits. Each CMOS tree circuit includes a signal input line 19, a signal output line 20, and a pair of tree circuits, i.e., an N-ch tree circuit of N-ch pass transistor logic and a P-ch tree circuit of P-ch pass transistor logic that is inverted logic of the N-ch tree circuit. At least one or all of the transistors within the P-ch tree circuit 13, 15, 17 have the structure of the P-ch modulation MOS transistor of FIG. 1A. The modulation substrate bias supply line 7 for supplying a modulation substrate bias Vb is connected to the substrate region of each P-ch modulation MOS transistor. The power supply line 5 for supplying a power supply potential Vdd is connected to the substrate region of each normal P-ch MOS transistor in the p-ch tree circuit 13, 15, 17. The power supply line 5 is also connected to the drain of every P-ch transistor in the P-ch tree circuit 13, 15, 17. At least one or all of the transistors within the N-ch tree circuit 14, 16, 18 have the structure of the N-ch modulation MOS transistor of FIG. 1A. The modulation substrate bias supply line 8 for supplying a modulation substrate bias Vb' is connected to the substrate region of each N-ch modulation MOS transistor. The ground line 6 for supplying a ground potential Vss is connected to the substrate region of each normal N-ch MOS transistor in the N-ch tree circuit 14, 16, 18. The ground line 6 is also connected to the source of every N-ch transistor in the N-ch tree circuit 14, 16, 18.

In this modification, the CMOS tree circuits are provided instead of the inverters of FIG. 1A. In this case as well, during switching operation of the entire circuit, the N-ch tree circuit and the P-ch tree circuit are equivalent to the inverter including the N-ch modulation MOS transistor and the P-ch modulation MOS transistor each having impedance equivalent to the driving impedance of the respective trees.

In other words, providing the N-ch modulation MOS transistor in the N-ch tree circuits enables modulation of a current flowing through the ground line 6, a through current flowing from the signal output line 20 during a switching transient period, and a falling waveform. Moreover, providing the P-ch modulation MOS transistor in the P-ch tree circuits enables modulation of a current flowing through the power supply line 5, a through current flowing into the signal output line 20 during a switching transient period, and a rising waveform.

Note that, in this modification as well, any one of the structure using the N-well process of FIG. 3, the structure using the twin-well process of FIG. 4, and the structure using the SOI substrate of FIG. 5 may be employed as the structure of the modulation MOS transistor.

As described above, according to the method for reducing the EMI radiation using the modulation MOS transistor of the present invention, a significant change in circuit structure is not required, and a separate substrate potential need only be used for each modulation MOS transistor. Accordingly, this method is significantly advantageous in that it can be applied not only to the inverters but also to any of the CMOS tree circuits.

(Second Embodiment)

Hereinafter, a semiconductor integrated circuit device of the second embodiment will be described. According to the second embodiment, whether or not a modulation MOS transistor is provided in the semiconductor integrated circuit device is determined according to the circuit characteristics. In the example described herein, whether or not a modulation MOS transistor is used is determined based on the change rate (dI/dt) and variation $\{(dI/dt)*\Delta t\}$ of a power supply current I. This is based on, e.g., the following experimental facts: as the change rate (dI/dt) of the power supply current I is increased, the frequency band of the EMI radiation is extended to a higher frequency band; and in the case where the transition time ($\Delta t$) is short enough, the EMI radiation power (electric field intensity) is increased as the variation $\{(dI/dt)*\Delta t\}$ of the power supply current I is increased.

Figure 8:
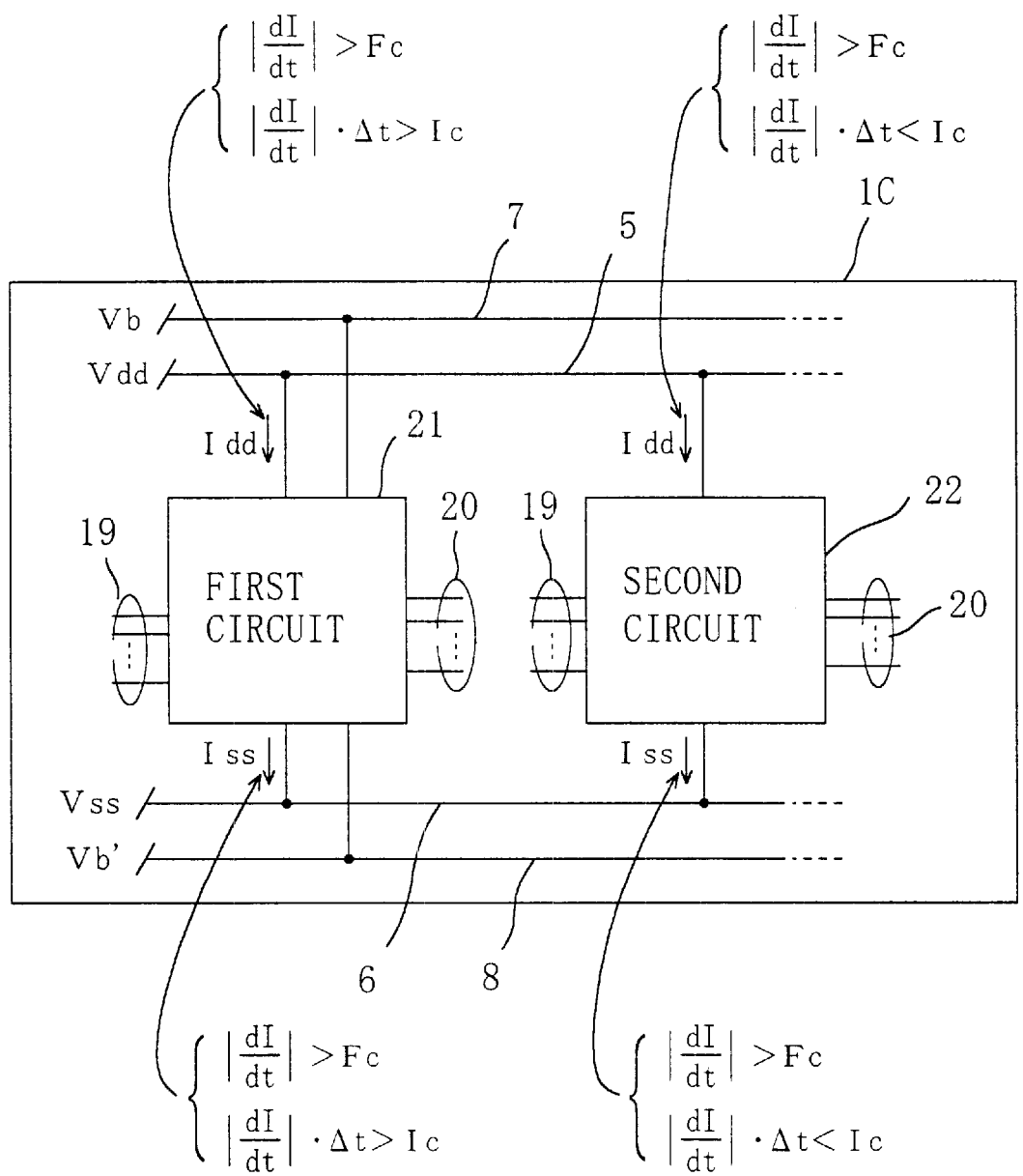
FIG. 8 is a block circuit diagram showing a semiconductor integrated circuit device according to a second embodiment.

FIG. 8 is a block circuit diagram showing the structure of the semiconductor integrated circuit device 1C of the present embodiment. As shown in FIG. 8, the semiconductor integrated circuit device 1C of the present embodiment includes a first circuit 21 including modulation MOS transistors, a second circuit 22 including no modulation MOS transistor, a power supply line 5 for supplying a power supply potential Vdd, a ground line 6 for supplying a ground potential Vss, a modulation substrate bias supply line 7 for supplying a modulation substrate bias Vb, a modulation substrate bias supply line 8 for supplying a modulation substrate bias Vb', signal input lines 19 for inputting a signal such as data, and signal output lines 20 for outputting an output signal.

The power supply line 5 for supplying a power supply potential Vdd, the ground line 6 for supplying a ground potential Vss, the signal input lines 19 and the signal output lines 20 are connected to the first and second circuits 21 and 22. A power supply current Idd flows from the power supply line 5 into the first and second circuits 21 and 22, and a power supply current Iss flows into the ground line 6.

Herein, the change rate (dI/dt) and variation $\{(dI/dt)*\Delta t\}$ of the power supply current Idd of the first circuit 21 exceed the respective threshold values Fc and Ic, and the change rate (dI/dt) and variation $\{(dI/dt)*\Delta t\}$ of the power supply current Iss of the first circuit 21 exceed the respective threshold values Fc and Ic. Therefore, both P-ch and N-ch modulation MOS transistors are used in the first circuit 21. On the other hand, the change rate (dI/dt) of the power supply currents Iss and Idd of the second circuit 22 is equal to or higher than the threshold value Fc, but the variation $\{(dI/dt)*\Delta t\}$ of the power supply currents Iss and Idd is equal to or less than the threshold value Ic. Therefore, it is determined that the EMI radiation intensity is low, and only normal MOS transistors are provided in the second circuit 22.

The change rate $|dI/dt|$ and variation $\{|dI/dt|*\Delta t\}$ of the power supply currents Idd and Iss can be obtained by spice and 3D-electromagnetic simulation.

FIGS. 17A to 17C are diagrams respectively showing an example of the simulation result of various current waveforms I, and their corresponding change rate $|dI/dt|$ and variation $\{|dI/dt|*\Delta t\}$. FIG. 17A shows current waveforms having a potential Vdd that varies with time. FIG. 17B shows absolute values of their differential waveforms. As shown in FIG. 17B, the magnitude of the peak value Ip of the current has nothing to do with the magnitude of the absolute value $|dI/dt|$ of the differential waveform. The absolute values $|dI/dt|$ of the differential waveforms corresponding to the current waveforms with peak values Ip1 and Ip2 exceed the threshold vale Fc. However, the absolute value $|dI/dt|$ of the differential waveform corresponding to the current waveform with a relatively large peak value Ip3 does not exceed the threshold vale Fc. FIG. 17C shows the absolute value $|dI/dt|$ of each differential current waveform multiplied by a pulse width $\Delta t$ of the corresponding current waveform. As shown in FIG. 17C, only the variation $\{|dI/dt|*\Delta t\}$ of the current corresponding to the current waveform with a peak value Ip2 exceeds the threshold value Ic, and the variations $\{|dI/dt|*\Delta t\}$ of the current corresponding to the other current waveforms with peak values Ip1 and Ip3 do not exceed the threshold value Ic. Note that the absolute value $|dI/dt|$ of the differential current waveform is herein used, a differential current value dI/dt itself may be used. In this case, negative values of Fc and Ic must be determined by, e.g., simply changing the sign.

Note that, in the case where only the change rate (dI/dt) and variation $\{(dI/dt)*\Delta t\}$ of the power supply current Idd of the first circuit 21 exceed the threshold value, a P-ch modulation MOS transistor and a normal N-ch MOS transistor may be provided in the first circuit 21. In the case where only the change rate (dI/dt) and variation $\{(dI/dt)*\Delta t\}$ of the power supply current Iss of the first circuit 21 exceed the threshold value, a normal P-ch MOS transistor and an N-ch modulation MOS transistor may be provided in the first circuit 21.

According to the present embodiment, unlike the first embodiment, whether or not a modulation MOS transistor is provided is determined without examining the circuit characteristics. Accordingly, the following effects can be obtained: unnecessarily providing a modulation MOS transistor would result in increased layout area due to an extended electrode of the modulation substrate bias Vb, Vb' of the modulation MOS transistor. In the present embodiment, the EMI radiation can be effectively reduced while minimizing an increase in layout area.

(Third Embodiment)

Hereinafter, another example of the semiconductor integrated circuit device will be described. In the present embodiment as well, whether or not a modulation MOS transistor is provided in the semiconductor integrated circuit device is determined according to the circuit characteristics.

Figure 9:
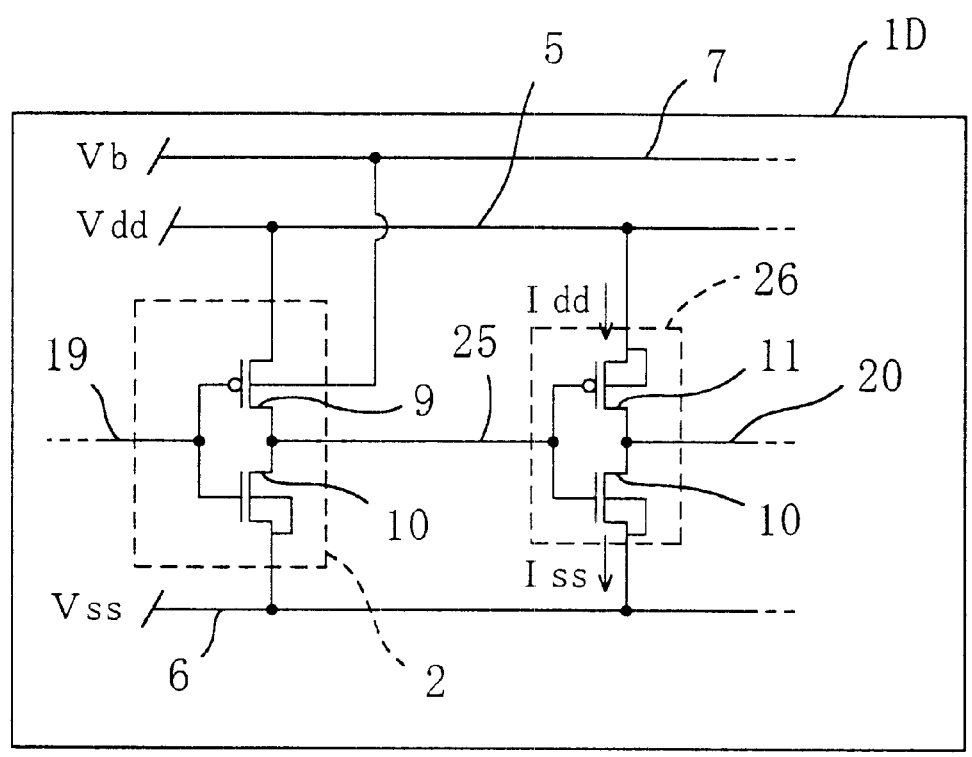
FIG. 9 is a block circuit diagram showing a semiconductor integrated circuit device according to a third embodiment.

FIG. 9 is a block circuit diagram showing the structure of a semiconductor integrated circuit device 1D according to the present embodiment. As shown in FIG. 9, the semiconductor integrated circuit device 1D of the present embodiment includes an inverter 2 of FIG. 1A including a P-ch modulation MOS transistor 9 and a normal N-ch MOS transistor 10, an inverter 26 for receiving an output of the inverter 2 through a gate signal line 25, and a signal output line 20 for transmitting an output signal from the inverter 26. Thus, the inverter 2 functions as a driving circuit of the inverter 26. The inverter 26 includes a normal P-ch MOS transistor 11 and a normal N-ch MOS transistor 10.

In the present embodiment, although the change rate (dI/dt) and variation {(dI/dt)*Δt} of both power supply currents Idd and Iss of the inverter 26 exceed the respective threshold values Fc and FI, the inverter 26 includes the normal MOS transistors. The reason for this is as follows: since the inverter 2 serving as a driving circuit includes the modulation MOS transistor (P-ch modulation MOS transistor 9), a modulated signal passes through the gate signal line 25 of the inverter 26 through which a current causing the EMI radiation flows. Thus, the switching time of the inverter 26 is modulated. As a result, energy distribution of electromagnetic waves resulting from switching of the inverter 26 has a wider, gentler frequency peak as compared to the case where the input signal is not modulated, whereby the EMI radiation intensity is reduced.

Note that, even when the inverter 2 serving as a driving circuit includes a normal P-ch MOS transistor and an N-ch modulation MOS transistor, the same effects as those of the present embodiment can be obtained.

As can be seen from the comparison between the P-ch modulation MOS transistor 9 and the normal N-ch MOS transistor 10 of FIG. 3, in the present embodiment, a common extended electrode can be used for the substrate contact region and the drain or source region of the normal MOS transistor. However, separate extended electrodes must be provided for the substrate contact region, drain region and source region of the modulation MOS transistor. A transistor through which a large current directly causing the EMI radiation flows has large layout area. When a modulation MOS transistor is used as the transistor having large layout area, the layout area is further increased due to the separate extended electrodes. The use of the present embodiment enables suppression of the EMI radiation to some extent even when a normal MOS transistor is used as a MOS transistor having large layout area. In other words, an increase in the layout area resulting from the use of the modulation MOS transistor can be suppressed as much as possible.

(Fourth Embodiment)

As described above, the delay time of a signal can be controlled with the amplitude of the modulation substrate bias Vb, Vb'. In view of this, a semiconductor integrated circuit device of the fourth embodiment will now be described. In the present embodiment, the amplitude of the modulation substrate bias Vb of a modulation MOS transistor is selected so as to adapt to a delay-time margin of the circuit.

Figure 10A:
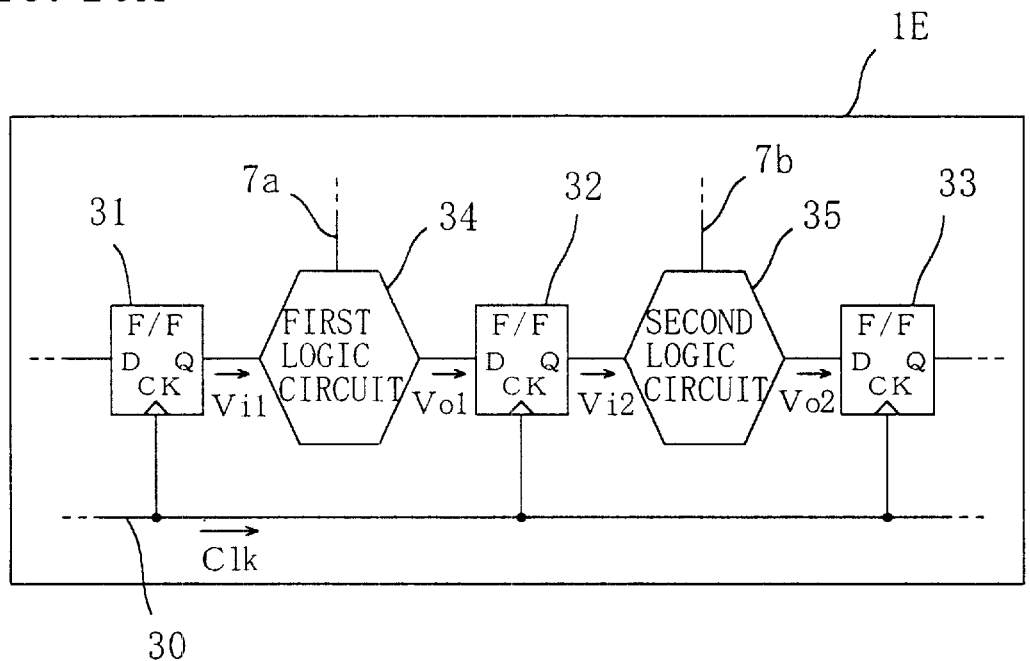
FIG. 10A is an electric circuit diagram showing a semiconductor integrated circuit device according to a fourth embodiment.

FIG. 10A is an electric circuit diagram showing the structure of the semiconductor integrated circuit device 1E of the present embodiment. The semiconductor integrated circuit device 1E includes a clock signal line 30 for supplying a clock signal Clk having a frequency fc and a period Tc (Tc=1/fc), flip-flops 31, 32 and 33 driven with the clock signal Clk supplied from the clock signal line 30, and first and second logic circuits 34 and 35 each including a combinational circuit and the like provided between the corresponding flip-flops. Each flip-flop 31, 32, 33 receives the data at an input port D and transmits the received data to an output port Q in synchronization with a rise of the clock signal Clk received at a clock input section CK. The data is retained at the output portion Q until the subsequent rising edge of the clock signal Clk. In this example, the first and second logic circuits 34 and 35 include a P-ch modulation MOS transistor. Modulation substrate biases Vb1 and Vb2 are respectively supplied to the logic circuits 34 and 35 through modulation substrate bias supply lines 7a and 7b.

Figure 10B:
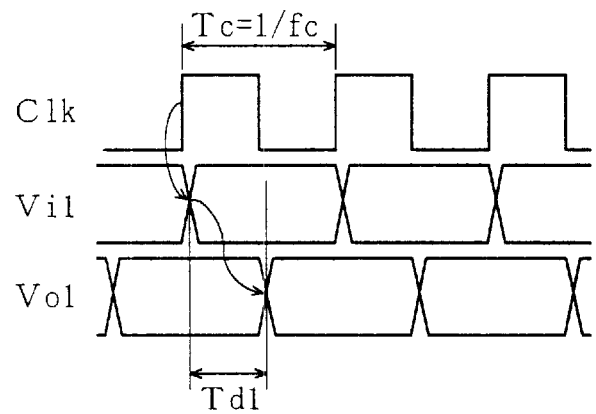
FIGS. 10B and 10C are timing charts respectively showing the state of a clock signal Clk, input data signal Vi1, Vi2 and output data signal Vo1, Vo2.
Figure 10C:
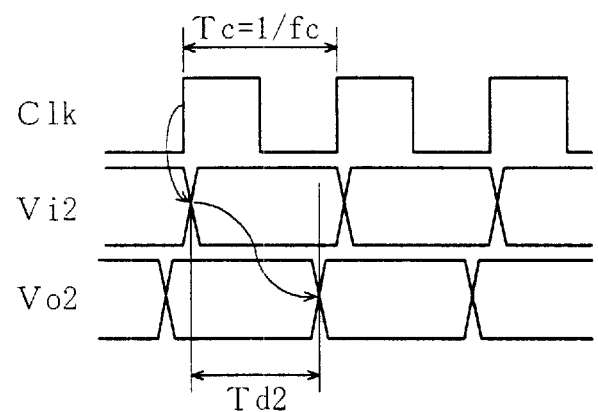

FIGS. 10B and 10C are timing charts respectively showing the state of the clock signal Clk, input data signal Vi1, Vi2 and output data signal Vo1, Vo2 in the first and second logic circuits 34, 35. The input data signal Vi1 is introduced into the first logic circuit 34 in synchronization with a rising edge of the clock signal Clk, and is output as output data signal Vo1 with only a delay Td1. Similarly, the input data signal Vi2 is introduced into the second logic circuit 35 in synchronization with a rising edge of the clock signal Clk, and is output as output data signal Vo2 with only a delay Td2. In order to sequentially transfer the data to the logic circuit, flip-flop, logic circuit and flip-flop in response to every rise of the clock signal Clk, at least the delay time Td1, Td2 in the logic circuits 34, 35 must be shorter than the period of the clock signal Clk. In the present embodiment, $$Tc > Td2 > Td1.$$

In other words, the first logic circuit 34 has a larger delay-time margin (Tc−Tdn (n=1, 2)) than that of the second logic circuit 35. Herein, the modulation substrate biases Vb1, Vb2 are set according to the following equations (12), (13):

$$Vb1 = Vdd - Vf + 0.5Va1 * \{\sin(2\pi * fm * t) + 1\} \tag{12}$$

$$Vb2 = Vdd - Vf + 0.5Va2 * \{\sin(2\pi * fm * t) + 1\} \tag{13}.$$

As shown in FIG. 1B, Va1 and Va2 are variation amplitudes of the modulation substrate biases Vb1 and Vb2, respectively. The delay time Td1, Td2 of each logic circuit 34, 35 is a function of the amplitude Va1, Va2, which increases with increase in amplitude Va1, Va2. Thus, the delay time Td1, Td2 can be set according to the following expressions (14), (15):

$$Tc > Td2 = f(Va2) > Td1 = g(Va1) \tag{14}$$

$$Va1 \geq Va2 \tag{15}.$$

In order to supply the modulation substrate bias Vb having a uniform variation amplitude Va to each circuit (in the case where a common modulation substrate bias Vb is supplied to each circuit), the variation amplitude Va must be set so as to adapt to the circuit having shorter delay time Td. This necessitates reduction in variation amplitude Va.

In contrast, according to the present embodiment, the modulation substrate bias Vb having a larger variation amplitude Va is applied to the circuit having a larger delay-time margin than to the circuit having a smaller delay-time margin. As a result, the EMI radiation of the entire integrated circuit device can be more effectively reduced as compared to the case where the modulation substrate bias Vb having a uniform variation amplitude Va is applied to each circuit.

Note that, in the example described in the present embodiment, each logic circuit 34, 35 includes a P-ch modulation MOS transistor. However, each logic circuit may include an N-ch modulation MOS transistor. In such a semiconductor integrated circuit device as well, the same effects can be obtained by applying a modulation substrate bias Vb' having a larger variation amplitude Va' to the circuit having a larger delay-time margin than to the circuit having a smaller delay-time margin.

(Fifth Embodiment)

Hereinafter, a semiconductor integrated circuit device incorporating a circuit for generating modulation substrate biases Vb, Vb' according to the fifth embodiment will be described.

Figure 11A:
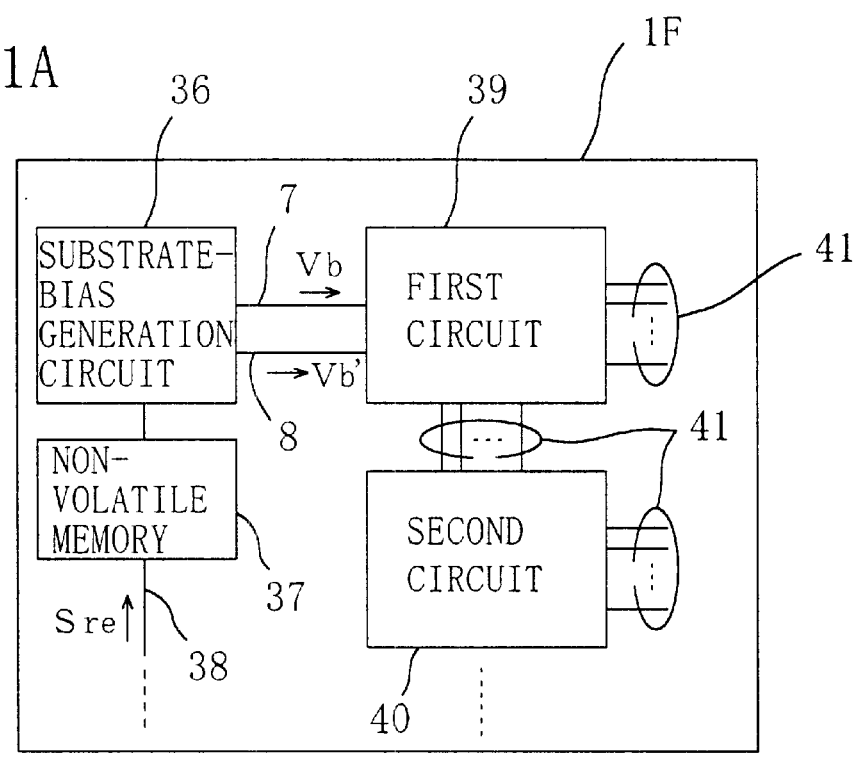
FIG. 11A is a block circuit diagram showing a semiconductor integrated circuit device according to a fifth embodiment.
Figure 11B:
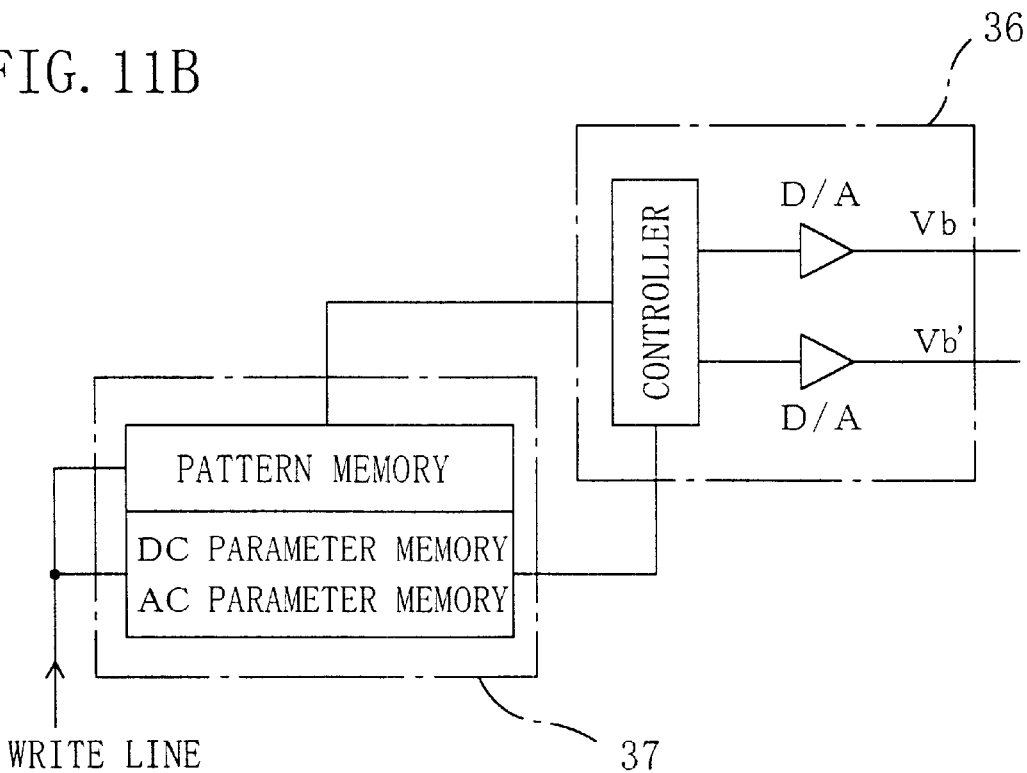
FIG. 11B is a partial enlarged view thereof.

FIG. 11A is a block circuit diagram schematically showing the structure of the semiconductor integrated circuit device 1F of the present embodiment, and FIG. 11B is a partial enlarged view thereof.

As shown in FIG. 11A, the semiconductor integrated circuit device 1F includes a modulation substrate bias generation circuit 36, a non-volatile memory 37 storing the data of production of the modulation substrate bias, a first circuit 39 and a second circuit 40. The first circuit 39 includes P-ch and N-ch modulation MOS transistors. The modulation substrate biases Vb and Vb' are respectively supplied from the modulation substrate bias generation circuit 36 to the P-ch and N-ch modulation MOS transistors through modulation substrate bias supply lines 7 and 8, whereby the EMI radiation from the first circuit 39 is reduced. The second circuit 40 does not include any modulation MOS transistor, but includes only normal MOS transistors.

As shown in FIG. 11B, the non-volatile memory 37 includes a pattern memory storing a waveform, a DC parameter memory storing an amplitude, offset and the like, and an AC parameter memory storing frequency information and the like. The substrate bias generation circuit 36 accesses the pattern memory, DC parameter memory and AC parameter memory of the non-volatile memory 37 in a cyclic manner so as to read the data therefrom and combine the read data into digital data to be applied to D/A (Digital-to-Analog) converters. For example, it is now assumed that a waveform pattern having a basic sine curve with a period of 1 and a frequency of 1 is used, the data of 10-kHz frequency is read from the AC parameter memory and the data of 200-mV amplitude is read from the DC parameter memory. In this case, these read data are combined into digital data for producing a sine curve of 200-mV amplitude and 10-kHz frequency. The digital data thus obtained is finally output from the D/A converters as substrate biases Vb, Vb', respectively.

The modulation substrate bias generation circuit 36 produces the modulation substrate biases Vb, Vb' based on the data in the non-volatile memory 37. Information on variation amplitudes Va, Va and waveform profiles of the modulation substrate biases Vb, Vb' can be written to the non-volatile memory 37 according to a data write signal Sre applied through a control signal line 38. In addition, the waveforms of the modulation substrate biases Vb, Vb' can be programmed. The modulation substrate biases Vb, Vb' need not have a uniform waveform in the entire semiconductor integrated circuit device 1F. As in the fourth embodiment, a variation amplitude, waveform and the like of the modulation substrate biases Vb, Vb' may be varied according to the characteristics (such as delay time) of each circuit in the semiconductor integrated circuit device 1F. The EMI significantly varies depending on the mount structure (which is selected according to a system) of the semiconductor integrated circuit device 1F. Accordingly, the EMI is tuned according to the application of the semiconductor integrated circuit device 1F. Programming the waveforms of the modulation substrate biases Vb, Vb' so as to minimize the EMI radiation intensity enables an appropriate modulation bias Vb, Vb' to be applied to each part of the semiconductor integrated circuit device 1F.

The modulation substrate bias generation circuit 36 is thus incorporated into the semiconductor integrated circuit device 1F so as to enable programming of the waveforms of the modulation substrate biases Vb, Vb'. Accordingly, in the case of a semiconductor integrated circuit device generating great EMI radiation, the modulation substrate biases Vb, Vb' can be programmed to have a large amplitude so as to reduce an operation-speed margin of the circuit. In contrast, in the case of a semiconductor integrated circuit device generating poor EMI radiation, the modulation substrate biases Vb, Vb' can be programmed to have a small amplitude so as to give priority to the operation speed of the circuit. This makes it possible to implement a plurality of kinds of semiconductor integrated circuit devices having the same structure and having an optimized balance between the EMI radiation and the operation speed.

(Sixth Embodiment)

Hereinafter, a semiconductor integrated circuit device using a memory cell array according to the sixth embodiment will be described. In the present embodiment, the semiconductor integrated circuit device uses modulation MOS transistors in order to reduce the EMI radiation. In the memory cell array such as ROM (Read Only Memory) and RAM (Random Access Memory), a multiplicity of bit lines must be simultaneously precharged, whereby an abrupt peak current flows through a power supply line, causing the EMI radiation. The following description is given for the RAM, but the present embodiment is also applicable to the ROM.

Figure 12:
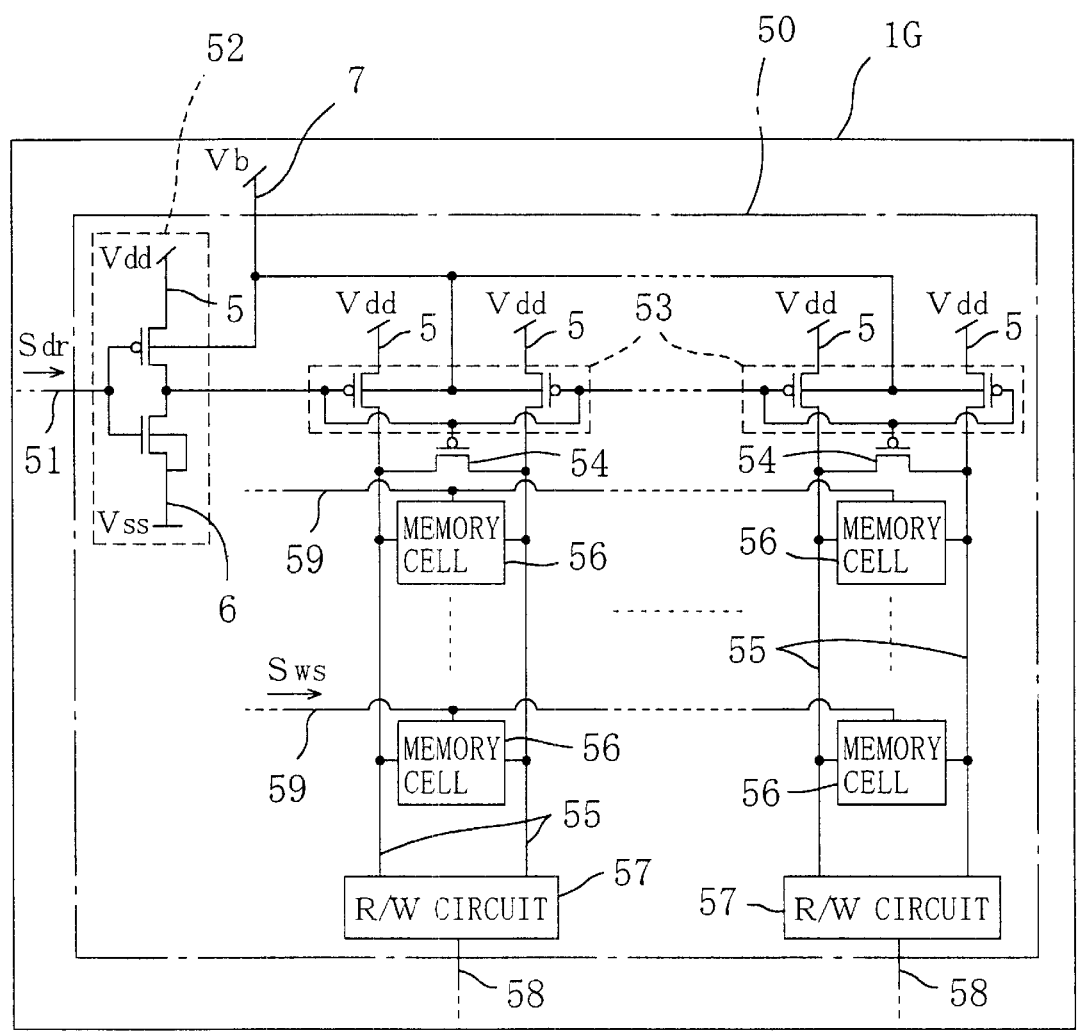
FIG. 12 is an electric circuit diagram showing a semiconductor integrated circuit device according to a sixth embodiment.

FIG. 12 is an electric circuit diagram showing the structure of the semiconductor integrated circuit device 1G of the present embodiment. As shown in FIG. 12, the semiconductor integrated circuit device 1G functioning as a RAM includes a memory cell array 50 having a multiplicity of RAM memory cells 56 arranged in a matrix, a signal input line 51 for applying a driving signal Sdr to the memory cell array 50, a driving circuit 52 formed from an inverter, for receiving the driving signal Sdr, bit line pairs 55, precharge transistor pairs 53 each formed from two P-ch MOS transistors and provided across the corresponding bit line pair 55, equalizing transistors 54 each provided across the corresponding bit line pair 55, read/write (R/W) circuits 57 each provided at the end of the corresponding bit line pair 55 and including a sense amplifier and a write driver, signal output lines 58 for outputting the data from the corresponding R/W circuit 57, and word lines 59. Upon reading or writing the data, a memory cell 56 is selected according to a word selection signal Sws applied through the selected word line 59, so that the data is read from or written to the selected memory cell 56 by the corresponding R/W circuit 57. When the memory cell 56 is selected according to the word selection signal Sws, the precharge transistor pairs 53 for the respective bit line pairs 55 are turned on to precharge (i.e., charge) the bit line pairs 55 toward a power supply potential Vdd. This precharge operation is conducted in order to prevent unexpected data from being written to the memory cell 56 due to the charges present on the bit line pair 55 and to ensure the operation of the sense amplifier. During the precharge operation of the precharge transistor pairs 53, the equalize transistors 54 are turned on to equalize the potential on the bit line pairs 55, thereby increasing the operation speed of the sense amplifier. The precharge transistor pairs 53 and the driving circuit 52 thereof include P-ch modulation MOS transistors. A modulation substrate bias supply line 7 for supplying a modulation substrate bias Vb to these P-ch modulation MOS transistors is extended to the outside of the memory cell array 50.

According to the present embodiment, the same effects as those of the first embodiment can be obtained by modulating a substrate potential of the P-ch modulation MOS transistor in the driving circuit 52 by the modulation substrate bias Vb. Moreover, by modulating a substrate potential of the P-ch modulation MOS transistors of the precharge transistor pairs 53, the driving capability of the precharge transistor pairs 53 and the timing at which the precharge transistor pairs 53 are turned on are modulated upon precharge operation. As a result, the peak value of a power supply current flowing from a power supply line 5 into the precharge transistor pairs 53 is suppressed, whereby the EMI radiation is reduced.

Note that, as the number of bit line pairs 55 to be precharged simultaneously is increased, the present embodiment has a greater effect of reducing the EMI radiation.

Note that the precharge transistor pairs 53 and the memory cells in the memory array 50 can be formed on a common substrate. Therefore, by supplying the modulation substrate bias Vb to the precharge transistor pairs 53 from a local point such as the end or intermediate point of the substrate structure of the precharge transistor pairs 53, the respective switching timings of the precharge transistor pairs 53 can be widely varied using also the delay of the modulation substrate bias Vb due to a high substrate resistance. As a result, the EMI radiation can be more effectively reduced.

Note that although the above description of the present embodiment focuses on the transistors in the precharge transistor pairs, the memory cell array also has the R/W circuits 57 as circuit portions that operate in parallel. Therefore, the EMI radiation can be reduced by providing a modulation MOS transistor in the R/W circuits 57. However, a circuit requiring a sensitive timing operation such as an actuation-type circuit is generally used for the R/W circuits 57. Therefore, providing a modulation MOS transistor in the R/W circuit 57 requires careful timing design.

(Seventh Embodiment)

Hereinafter, a semiconductor integrated circuit device including modulation MOS transistors in a driving circuit of bus signal lines according to the seventh embodiment will be described. In the semiconductor integrated circuit device including a driving circuit for driving a plurality of bus signal lines simultaneously and in parallel, an abrupt peak current flows through a power supply line in response to simultaneous transition of the driving data. Therefore, great EMI radiation may possibly be generated. Moreover, the bus signal lines are likely to be longer than a normal wiring. When the bus signal lines have a length of several centimeters or more, the EMI radiation from the bus signal lines themselves is considerably increased.

Figure 13:
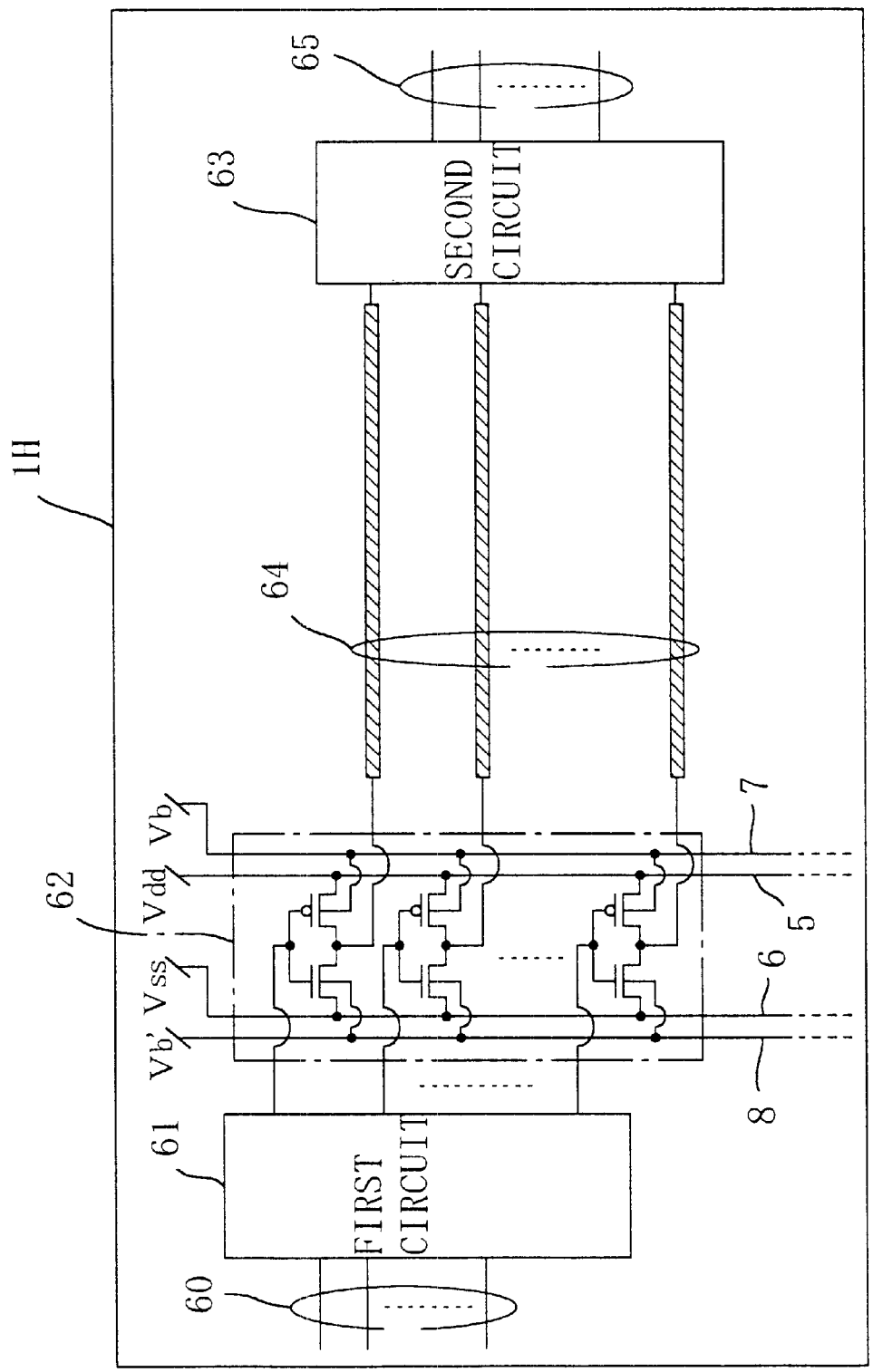
FIG. 13 is an electric circuit diagram showing a semiconductor integrated circuit device according to a seventh embodiment.

FIG. 13 is a diagram showing the structure of the semiconductor integrated circuit device 1H of the present embodiment. As shown in FIG. 13, the semiconductor integrated circuit device 1H includes signal input lines 60 for inputting the data having a prescribed number of bits, a first circuit 61 for receiving each bit signal of the data, a driving circuit 62 formed from an array of inverters using P-ch and N-ch modulation MOS transistors, for transmitting the data onto bus signal lines, a second circuit 63 for receiving an output of the driving circuit 62, bus signal lines 64 of a prescribed number of bits, for transmitting a driving signal from the driving circuit 62 to the second circuit 63, and signal output lines 65 for outputting an output signal of the second circuit 63. In the driving circuit 62, the substrate region of each P-ch modulation MOS transistor is connected to a modulation substrate bias supply line 7 for supplying a modulation substrate bias Vb, and the substrate region of each N-ch modulation MOS transistor is connected to a modulation substrate bias supply line 8 for supplying a modulation substrate bias Vb'. Each P-ch modulation MOS transistor has its drain connected to a power supply line 5 for supplying a power supply potential Vdd, and each N-ch modulation MOS transistor has its source connected to a ground line 6 for supplying a ground potential Vss.

An output of the first circuit 61 is applied to the driving circuit 62, and an output of the driving circuit 62 is transmitted to the second circuit 63 through the plurality of long bus signal lines 64. The EMI radiation from the power supply line 5 and the bus signal lines 64 is maximized when every bit of the data transitions from L (Low) level to H (High) level or vice versa in the respective bus signal lines 64. By modulating the substrate potential of each modulation MOS transistor in the driving circuit 62 by the modulation substrate biases Vb, Vb', an output waveform of the driving circuit 62, i.e., the timing and slew rate of the rise and fall, is modulated, whereby the EMI radiation from the entire semiconductor integrated circuit device 1H is reduced. Reduction in EMI radiation by modulation of the waveform and slew rate is particularly significant when the bus signal lines 64 have a long wiring length and must be driven at a high speed.

(Eighth Embodiment)

Hereinafter, a semiconductor integrated circuit device including a modulation MOS transistor in driving circuits of pads for transmitting a signal with an external equipment according to the eighth embodiment will be described. A pad is generally connected to an external wiring extended from the semiconductor integrated circuit device and having a length of several to several tens of centimeters. This external wiring serves as an antenna. Therefore, the waveform of a signal output from the pat onto the external wiring has a great effect on the EMI radiation.

Figure 14:
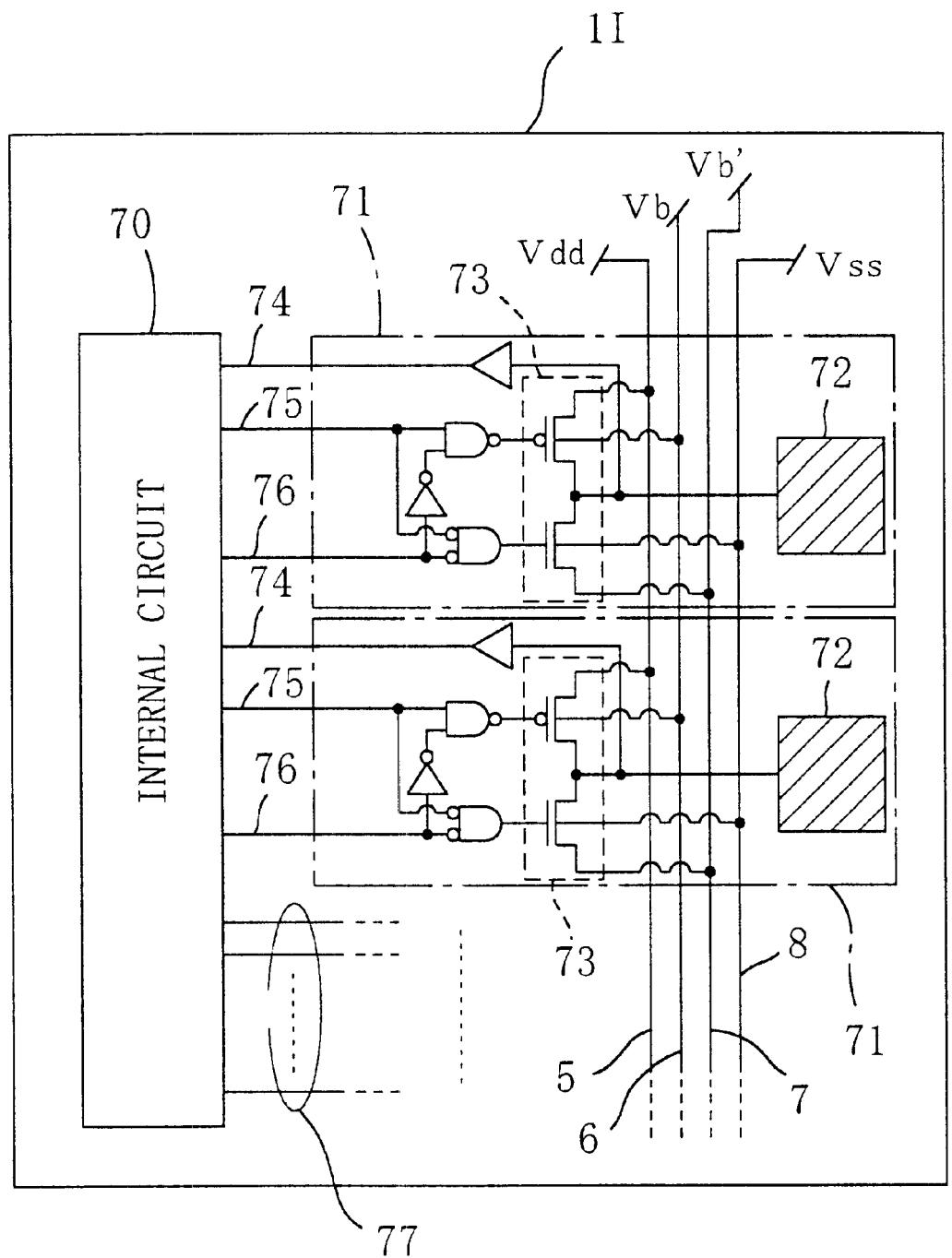
FIG. 14 is an electric circuit diagram showing a semiconductor integrated circuit device according to an eighth embodiment.

FIG. 14 is an electric circuit diagram showing the structure of the semiconductor integrated circuit device 1I according to the present embodiment. As shown in FIG. 14, the semiconductor integrated circuit device 1I includes an internal circuit 70, pad circuits 71 for transmitting a signal between the internal circuit 70 and an external equipment, pads 72 respectively provided in the pad circuits 71, driving circuits 73 for transmitting a signal to the corresponding pad 72, signal input lines 74 for transmitting to the internal circuit 70 an input signal applied from the external equipment to the corresponding pad 72, signal output lines 75 for transmitting from the internal circuit 70 to the corresponding driving circuit 73 an output signal to the external equipment, control signal lines 76 for transmitting a control signal for controlling the operation of the corresponding driving circuit 73, and signal lines 77 for outputting various data from the internal circuit 70. In the present embodiment, the pad circuits 71 have a bi-directional function. However, this is only by way of example, and the present embodiment is also applicable to the case where an output pad circuit and an input pad circuit are separately provided.

In the pad circuit 71, a signal applied from the external equipment to the pad 72 is applied to the internal circuit 70 through the signal input line 74. At this time, a control signal transmitted from the control signal line 76 is raised to H level so that the driving circuit 73 connected to the pad 72 is rendered in a high-impedance state. An output transmitted from the internal circuit 70 onto the signal output line 75 is buffered by the driving circuit 73 including P-ch and N-ch modulation MOS transistors, and then output from the pad 72 to the external equipment. At this time, the output from the driving circuit 73 is modulated with the modulation substrate bias Vb, Vb'. Therefore, the rise and fall timing of the output signal from the pad 72 is modulated, whereby the EMI radiation from the power supply line 5 and the ground line 7 is reduced. Moreover, the slew rate of the output signal from the pad 72 is modulated, thereby reducing the EMI radiation from packaging parts (such as leads) of the semiconductor integrated circuit device 1I connected to the pad 72, and wirings on the circuit board (such as printed circuit board).

(Ninth Embodiment)

Hereinafter, a semiconductor integrated circuit device according to the ninth embodiment will be described. In the ninth embodiment, the concept of EMI radiation control with a modulation MOS transistor is applied to a circuit IP (Intellectual Property), assets of the existing design.

Figure 15:
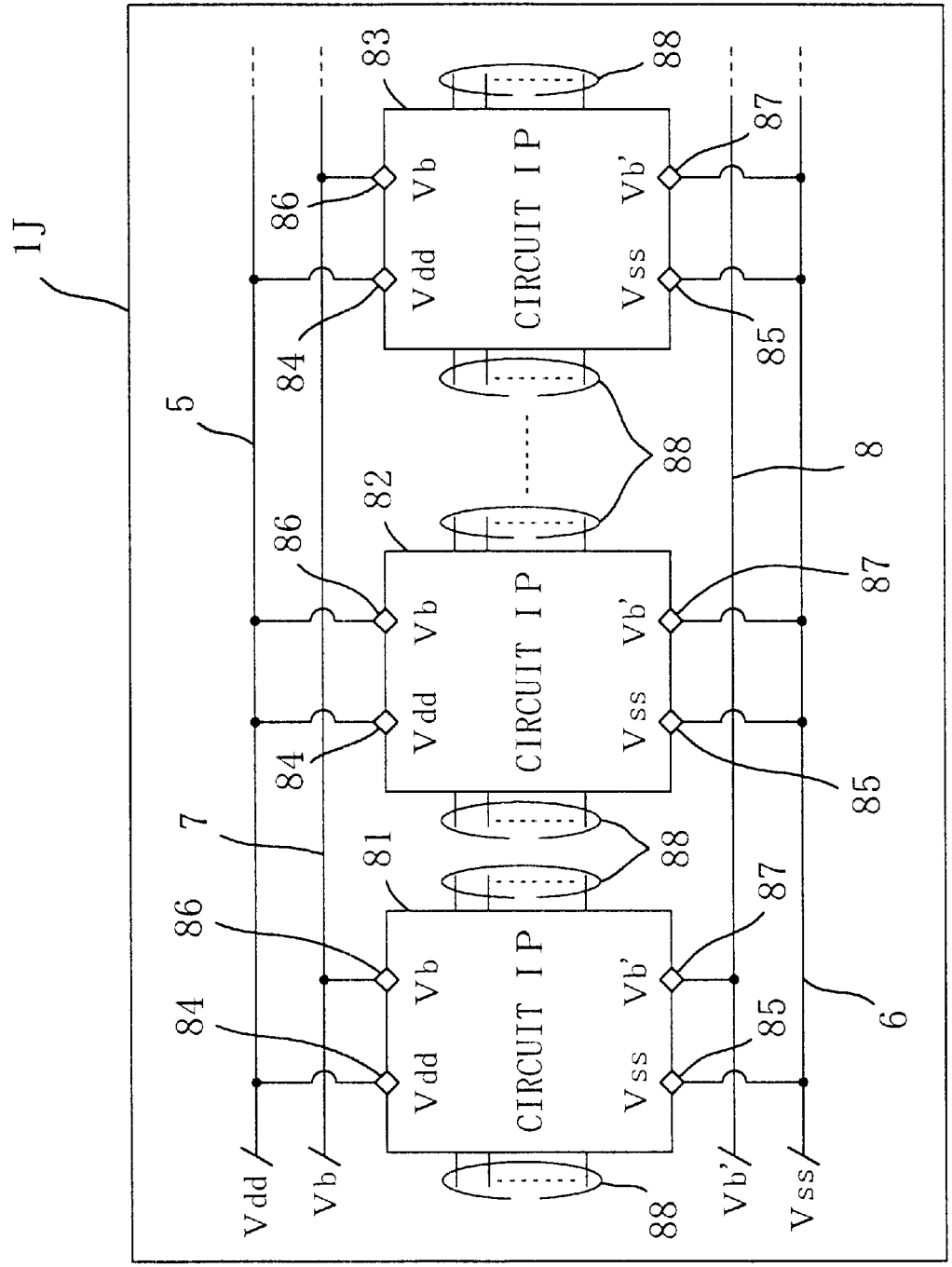
FIG. 15 is a block circuit diagram showing a semiconductor integrated circuit device according to a ninth embodiment.

FIG. 15 is a block circuit diagram showing the structure of the semiconductor integrated circuit device 1J according to the present embodiment. As shown in FIG. 15, the semiconductor integrated circuit device 1J includes general-purpose designed circuit IPs 81, 82, 83, a power supply line 5 for supplying a power supply potential Vdd, a ground line 6 for supplying a ground potential Vss, a modulation substrate bias supply line 7 for supplying a modulation substrate bias Vb, and a modulation substrate bias supply line 8 for supplying a modulation substrate bias Vb'. Each circuit IP 81, 82, 83 includes P-ch and N-ch modulation MOS transistor. Each circuit IP 81, 82, 83 also includes a power supply pin 84 for receiving a power supply potential Vdd, a ground pin 85 for receiving a ground potential Vss, a modulation substrate bias pin 86 for receiving a modulation substrate bias Vb, a modulation substrate bias pin 87 for receiving a modulation substrate bias Vb', and signal pins 88 for inputting/outputting a signal. The modulation substrate bias pins 86, 87 have substantially the same structure as that of the other pins. Logic information and positional information of the design are applied to the modulation substrate bias pins 86, 87.

In the circuit IP 81, the modulation substrate bias pin 86 is connected to the modulation substrate bias supply line 7 so that the P-ch modulation MOS transistor receives a modulation substrate bias Vb. The modulation substrate bias pin 87 is connected to the modulation substrate bias supply line 8 so that the N-ch modulation MOS transistor receives a modulation substrate bias Vb'. Thus, the circuit IP 81 is used as a low-EMI-radiation-oriented circuit IP.

In the circuit IP 82, the modulation substrate bias pin 86 is connected to the power supply line 5 instead of the modulation substrate bias supply line 7, and the modulation substrate bias pin 87 is connected to the ground line 6 instead of the modulation substrate bias supply line 8. In other words, the P-ch and N-ch modulation MOS transistors in the circuit IP 82 operate as normal MOS transistors, and the circuit IP 82 is not subjected to modulation with the varying modulation substrate biases Vb, Vb'. Thus, the circuit IP 82 is used as a speed-oriented circuit IP.

In the circuit IP 83, the modulation substrate bias pin 86 is connected to the modulation substrate bias supply line 7, whereas the modulation substrate bias pin 87 is connected to the ground line 6 instead of the modulation substrate bias supply line 8. In other words, in the circuit IP 83, the N-ch modulation MOS transistor operates as a normal MOS transistor, and only the P-ch modulation transistor is subjected to modulation. Thus, the circuit IP 83 is used as a circuit IP oriented toward the speed and low EMI radiation.

Thus, the modulation MOS transistors are provided in each circuit IP and pins for receiving a modulation substrate bias are extended in advance to each circuit IP. This enables the circuit IPs having the same structure to deal with various requirements from speed-oriented to low-EMI-radiation-oriented requirements. In general, the transistor-integration conditions of the circuit IP cannot be limited. Therefore, estimation of the EMI radiation level is difficult. However, the use of the present embodiment enables the general-purpose designed circuit IP to be reused without limiting the applicable range of the circuit IP to the applications oriented toward low EMI radiation.

(Tenth Embodiment)

Hereinafter, an electronic equipment having IC (Integrated Circuit) chips mounted on a circuit board according to the tenth embodiment will be described. In the tenth embodiment, the 1C chips include modulation MOS transistors for EMI radiation control.

Figure 16:
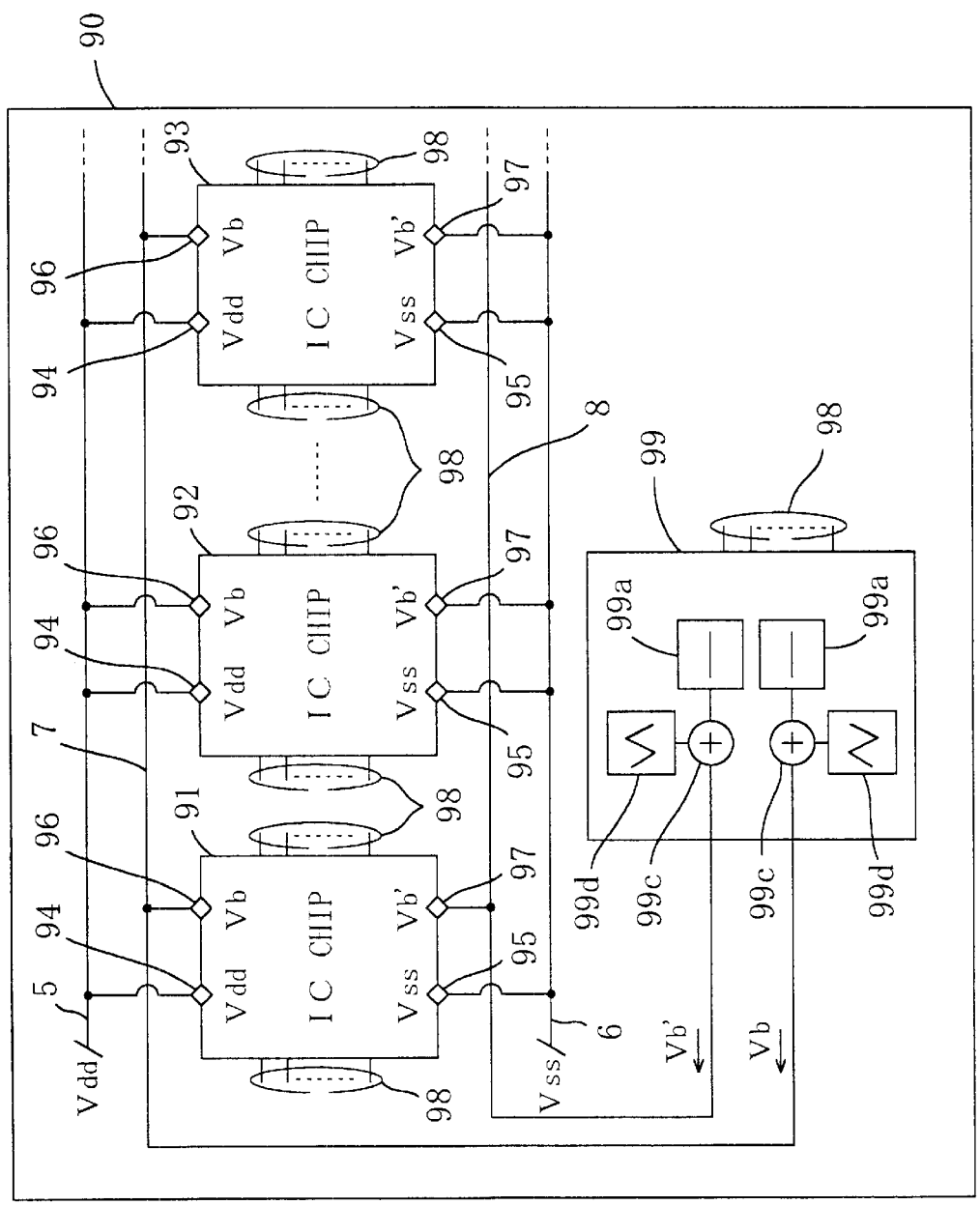
FIG. 16 is a block diagram showing the structure on a single circuit board provided in an electric equipment including semiconductor integrated circuit devices according to a tenth embodiment.

FIG. 16 is a block circuit diagram showing the structure on a single circuit board provided in the electronic equipment including semiconductor integrated circuit devices according to the present embodiment. As shown in FIG. 16, on the circuit board 90 such as printed circuit board are mounted first to third 1C chips 91, 92, 93, i.e., semiconductor integrated circuit devices, an 1C chip 99 for generating modulation substrate biases, a power supply line 5 for supplying a power supply potential Vdd, a ground line 6 for supplying a ground potential Vss, a modulation substrate bias supply line 7 for supplying a modulation substrate bias Vb, and a modulation substrate bias supply line 8 for supplying a modulation substrate bias Vb'. Each 1C chip 91, 92, 93 includes P-ch and N-ch modulation MOS transistors. Each 1C chip 91, 92, 93 also includes a power supply pad 94 for receiving a power supply potential Vdd, a ground pad 95 for receiving a ground potential Vss, a modulation substrate bias pad 96 for receiving a modulation substrate bias Vb, a modulation substrate bias pad 97 for receiving a modulation substrate bias Vb', and signal pads 98 for inputting/outputting a signal. The modulation substrate bias pads 96, 97 have substantially the same structure as that of the other pads. Logic information and positional information of the design are applied to the modulation substrate bias pads 96, 97.

The 1C chip 99 supplies a modulation substrate bias Vb through the modulation substrate bias supply line 7 and also supplies a modulation substrate bias Vb' through the modulation substrate bias supply line 8. The 1C chip 99 includes DC (Direct-Current) level generation circuits 99a for generating a steady-state DC voltage (e.g., a potential on the centerline of the waveform of FIG. 1B or 1C), AC (Alternating-Current) level generation circuits 99d for generating a time-varying voltage (e.g., the waveform of FIG. 1B or 1C), and level adding circuits 99c for combining the outputs of the corresponding DC level generation circuit 99a and the corresponding AC level generation circuit 99d to produce a modulation substrate bias.

In the 1C chip 91, the modulation substrate bias pad 96 is connected to the modulation substrate bias supply line 7 so that the P-ch modulation MOS transistor in the chip receives a modulation substrate bias Vb. The modulation substrate bias pad 97 is connected to the modulation substrate bias supply line 8 so that the N-ch modulation MOS transistor in the chip receives a modulation substrate bias Vb'. Thus, the 1C chip 91 is used as a low-EMI-radiation-oriented chip.

In the 1C chip 92, the modulation substrate bias pad 96 is connected to the power supply line 5 instead of the modulation substrate bias supply line 7, and the modulation substrate bias pad 97 is connected to the ground line 6 instead of the modulation substrate bias supply line 8. In other words, the P-ch and N-ch modulation MOS transistors in the IC chip 92 operate as normal MOS transistors, and the IC chip 92 is not subjected to modulation with the varying modulation substrate biases Vb, Vb'. Thus, the IC chip 92 is used as a speed-oriented chip.

In the IC chip 93, the modulation substrate bias pad 96 is connected to the modulation substrate bias supply line 7, whereas the modulation substrate bias pad 97 is connected to the ground line 6 instead of the modulation substrate bias supply line 8. In other words, in the IC chip 93, the N-ch modulation MOS transistor operates as a normal MOS transistor, and only the P-ch modulation transistor is subjected to modulation. Thus, the IC chip 93 is used as a chip oriented toward the speed and low EMI radiation.

Thus, the modulation MOS transistors are provided in each IC chip and the pads for receiving a modulation substrate bias are extended in advance to each circuit IP. This enables the IC chips having the same structure to be selectively used as various IC chips from speed-oriented to low-EMI-radiation-oriented chips according to the mounting condition of each IC chip and other members on the circuit board 90.

Moreover, supplying the modulation substrate biases Vb, Vb' collectively from the IC chip 99 to each IC chip 91, 92, 93 eliminates the need to provide a modulation substrate bias generation circuit in each IC chip 91, 92, 93, allowing for reduction in overall costs of the semiconductor integrated circuit device.

Moreover, the IC chip for generating modulation substrate biases need not be mounted on the same circuit board as that of the IC chips including modulation MOS transistors. The effects of the present embodiment can be obtained as long as the IC chip for generating modulation substrate biases is mounted together with the modulation MOS transistors in a single electronic equipment (e.g., a mobile communication equipment).

What is claimed is:

1. A semiconductor integrated circuit device integrating a plurality of MIS (Metal Insulator Semiconductor) transistors each having its source and drain provided in a respective region of a semiconductor substrate that is surrounded by a substrate region, and its gate provided on a region of the semiconductor substrate that is located between the source and drain, wherein
    the plurality of MIS transistors include at least one of a P-channel modulation MIS transistor and an N-channel modulation MIS transistor, a modulation substrate bias Vb varying with a prescribed amplitude within such a range that causes no latch-up is applied to the P-channel modulation MIS transistor, and a modulation substrate bias Vb' varying with a prescribed amplitude within such a range that causes no latch-up is applied to the N-channel modulation MIS transistor.

2. The semiconductor integrated circuit device according to claim 1, wherein
    the modulation substrate bias Vb varying with the prescribed amplitude within a range of Vb≧Vdd−Vf is applied to a substrate region of the P-channel modulation MIS transistor, where Vdd is a drain voltage, Vss is a source voltage, and Vf is a forward voltage across a PN junction between the drain and the substrate region, and the modulation substrate bias Vb' varying with the prescribed amplitude within a range of Vb'≦Vss+Vf' is applied to a substrate region of the N-channel modulation MIS transistor, where Vdd is a drain potential, Vss is a source potential, and Vf is a forward voltage across a PN junction between the substrate region and the source.

3. The semiconductor integrated circuit device according to claim 1, further comprising:
    a driving circuit for driving a gate electrode of the MIS transistors through which a current having an at least predetermined change rate and at least predetermined variation flows between the drain and source electrodes thereof during switching operation, and
    the driving circuit includes the modulation MIS transistor.

4. The semiconductor integrated circuit device according to claim 1, comprising:
    at least two circuits each including a plurality of MIS transistors including the modulation MIS transistor, and having different overall delay times, and
    a modulation substrate bias having a larger amplitude is applied to the circuit having a shorter delay time than to the circuit having a longer delay time.

5. The semiconductor integrated circuit device according to claim 1, further comprising a modulation substrate bias generation circuit having a function to program a waveform profile of the modulation substrate bias.

6. The semiconductor integrated circuit device according to claim 1, comprising:
    a memory cell array having a plurality of memory cells arranged therein;
    bit line pairs connected to the memory cell array;
    precharge transistors for precharging the bit line pairs; and
    a driving circuit for driving gate electrodes of the precharge transistors, wherein
    at least one of the driving circuit and the precharge transistors includes the modulation MIS transistor.

7. The semiconductor integrated circuit device according to claim 1, comprising:
    a circuit including a plurality of MIS transistors, the plurality of MIS transistors being part of the plurality of MIS transistors;
    a bus signal line extended from the circuit; and
    a driving circuit provided in the circuit, for outputting data to the bus signal line, the driving circuit including the modulation MIS transistor.

8. The semiconductor integrated circuit device according to claim 1, comprising a driving circuit of a pad for receiving and outputting a signal from and to an external equipment of the semiconductor integrated circuit device, the driving circuit of the pad including the modulation MIS transistor.

9. An electronic equipment having mounted therein a plurality of first semiconductor integrated circuit devices and a second semiconductor integrated circuit, wherein
    each of the first semiconductor integrated circuit devices is a semiconductor integrated circuit device integrating a plurality of MIS transistors each having its source and drain provided in a respective region of a semiconductor substrate that is surrounded by a substrate region, and its gate provided on a region of the semiconductor substrate that is located between the source and drain,
    the plurality of MIS transistors include at least one of a P-channel modulation MIS transistor and an N-channel modulation MIS transistor, a modulation substrate bias Vb varying with a prescribed amplitude within such a range that causes no latch-up is applied to the P-channel modulation MIS transistor, and a modulation substrate bias Vb' varying with a prescribed amplitude within such a range that causes no latch-up is applied to the N-channel modulation MIS transistor, and
    the second semiconductor integrated circuit device includes a modulation substrate bias generation circuit for generating the modulation substrate bias to be supplied to each of the first semiconductor integrated circuit devices.

10. The electronic equipment according to claim 9, wherein in the first semiconductor integrated circuit devices, the modulation substrate bias Vb varying with the prescribed amplitude within a range of Vb.Vdd−Vf is applied to a substrate region of the P-channel modulation MIS transistor, where Vdd is a drain potential, Vss is a source potential, and Vf is a forward voltage across a PN junction between the drain and the substrate region, and the modulation substrate bias Vb' varying with the prescribed amplitude within a range of Vb'.Vss+Vf' is applied to a substrate region of the N-channel modulation MIS transistor, where Vdd is a drain potential, Vss is a source potential, and Vf' is a forward voltage across a PN junction between the substrate region and the source.

* * * * *